US011552149B2

(12) United States Patent
Kim et al.

(10) Patent No.: US 11,552,149 B2
(45) Date of Patent: Jan. 10, 2023

(54) LIGHT EMITTING DISPLAY DEVICE AND MANUFACTURING METHOD THEREOF

(71) Applicant: Samsung Display Co., LTD., Yongin-si (KR)

(72) Inventors: Keun Woo Kim, Seongnam-si (KR); Tae Wook Kang, Seongnam-si (KR); Han Bit Kim, Seoul (KR); Bum Mo Sung, Hanam-si (KR); Do Kyeong Lee, Yongin-si (KR); Jae Seob Lee, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 33 days.

(21) Appl. No.: 17/062,299

(22) Filed: Oct. 2, 2020

(65) Prior Publication Data

US 2021/0280652 A1    Sep. 9, 2021

(30) Foreign Application Priority Data

Mar. 6, 2020    (KR) .......................... 10-2020-0028437

(51) Int. Cl.
*H01L 27/32* (2006.01)
*H01L 29/66* (2006.01)
(Continued)

(52) U.S. Cl.
CPC ...... *H01L 27/3262* (2013.01); *H01L 27/3265* (2013.01); *H01L 21/02532* (2013.01);
(Continued)

(58) Field of Classification Search
CPC ............. H01L 27/3262; H01L 27/3265; H01L 21/02532; H01L 21/02592; H01L 21/02661; H01L 21/02675; H01L 27/1222; H01L 27/1255; H01L 27/1274; H01L 29/42384; H01L 29/6675; H01L 29/78645; H01L 29/78672; H01L 29/78696; H01L 2029/42388; H01L 2227/323;
(Continued)

(56) References Cited

U.S. PATENT DOCUMENTS 9,991,312 B1 *  6/2018  Kim .................... H01L 27/156
2018/0158406 A1  6/2018  Kim et al.
2019/0165072 A1 *  5/2019  Wang ................. H01L 27/3265

FOREIGN PATENT DOCUMENTS

CN    108154846 A    6/2018
JP    200846427 A    2/2008
(Continued)

*Primary Examiner* — Mohammed R Alam
(74) *Attorney, Agent, or Firm* — Cantor Colburn LLP

(57) ABSTRACT

A light emitting display device includes: a light emitting element; a second transistor connected to a scan line; a first transistor which applies a current to the light emitting element; a capacitor connected to a gate electrode of the first transistor; and a third transistor connected to an output electrode of the first transistor and the gate electrode of the first transistor. Channels of the second transistor, the first transistor, and the third transistor are disposed in a polycrystalline semiconductor layer, and a width of a channel of the third transistor is in a range of about 1 μm to about 2 μm, and a length of the channel of the third transistor is in a range of about 1 μm to about 2.5 μm.

17 Claims, 20 Drawing Sheets

(51) Int. Cl.
    *H01L 27/12*     (2006.01)
    *H01L 29/423*    (2006.01)
    *H01L 29/786*    (2006.01)
    *H01L 21/02*     (2006.01)

(52) U.S. Cl.
    CPC .. *H01L 21/02592* (2013.01); *H01L 21/02661* (2013.01); *H01L 21/02675* (2013.01); *H01L 27/1222* (2013.01); *H01L 27/1255* (2013.01); *H01L 27/1274* (2013.01); *H01L 29/42384* (2013.01); *H01L 29/6675* (2013.01); *H01L 29/78645* (2013.01); *H01L 29/78672* (2013.01); *H01L 29/78696* (2013.01); *H01L 2029/42388* (2013.01); *H01L 2227/323* (2013.01)

(58) Field of Classification Search
    CPC ......... H01L 29/78675; H01L 29/66757; H01L 2251/55; H01L 27/1285; H01L 27/1214; H01L 29/7869; H01L 51/56; G09G 3/3233
    See application file for complete search history.

(56) References Cited

FOREIGN PATENT DOCUMENTS

| | | |
|---|---|---|
| KR | 100542982 B1 | 1/2006 |
| KR | 100752367 B1 | 8/2007 |
| KR | 100766905 B1 | 10/2007 |

* cited by examiner

FIG. 19
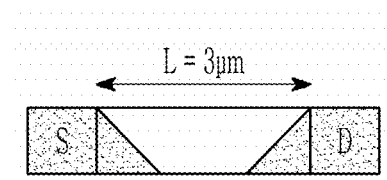
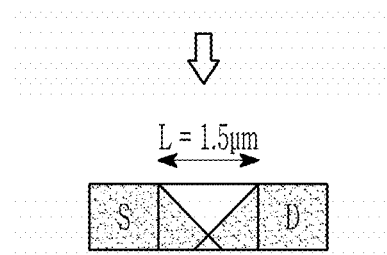

LIGHT EMITTING DISPLAY DEVICE AND MANUFACTURING METHOD THEREOF

This application claims priority to Korean Patent Application No. 10-2020-0028437, filed on Mar. 6, 2020, and all the benefits accruing therefrom under 35 U.S.C. § 119, the content of which in its entirety is herein incorporated by reference.

BACKGROUND

1. Field

The disclosure relates to a light emitting display device and a manufacturing method thereof, and more particularly, to a light emitting display device and a manufacturing method thereof that may display an image with a low frequency.

2. Description of the Related Art

Recently, an organic light emitting diode display, which is one of light emitting display devices, has attracted attention as a device for displaying an image.

Since the light emitting display device has a self-emission characteristic and may not include an additional light source, unlike a liquid crystal display device, the light emitting display device typically has thin thickness and light weight. Further, the light emitting display device has various desired characteristics such as low power consumption, high luminance, and high response speed.

Generally, the light emitting display device includes a substrate, a plurality of thin film transistors disposed on the substrate, a plurality of insulating layers disposed between wires included in the thin film transistors, and an organic light emitting element connected to the thin film transistors.

The light emitting display device typically includes a plurality of pixels, and each pixel includes a plurality of transistors. Each transistor may include a polycrystalline semiconductor. In this case, an amorphous semiconductor may be subjected to a crystallization process through heat treatment by a laser or the like to form a polycrystalline semiconductor.

SUMMARY

Embodiments are directed to a light emitting display device including a polycrystalline semiconductor, where no flicker is viewed or recognized when driven at a low frequency, and a manufacturing method thereof.

An embodiment provides a light emitting display device including: a light emitting element; a second transistor connected to a scan line; a first transistor which applies a current to the light emitting element; a capacitor connected to a gate electrode of the first transistor; and a third transistor connected to an output electrode of the first transistor and the gate electrode of the first transistor, where channels of the second transistor, the first transistor and the third transistor are disposed in a polycrystalline semiconductor layer, and a width of a channel of the third transistor is in a range of about 1 micrometer ($\mu$m) to about 2 $\mu$m, and a length of the channel of the third transistor is in a range of about 1 $\mu$m to about 2.5 $\mu$m.

In an embodiment, the third transistor may have a dual structure.

In an embodiment, the width of the channel of the third transistor may be in a range of ⅓ to ½ of a width of the channel of the first transistor.

In an embodiment, the light emitting display device may further include a fourth transistor which initializes the gate electrode of the first transistor to an initializing voltage, where a width of a channel of the fourth transistor may be in a range of about 1 $\mu$m to about 2 $\mu$m, and a length of the channel may be in a range of about 1 $\mu$m to about 2.5 $\mu$m.

In an embodiment, the fourth transistor may have a dual structure.

In an embodiment, the width of the channel of the fourth transistor may be in a range of ⅓ to ½ of a width of the channel of the first transistor.

In an embodiment, the light emitting display device may further include: a fifth transistor connected between the first transistor and a driving voltage line; and a sixth transistor connected between the light emitting element and the first transistor, where the length of the channel of the third transistor may be in a range of ⅓ to ½ of a length of a channel of the fifth transistor or the sixth transistor.

In an embodiment, a length of the channel of the fourth transistor may be in a range of ⅓ to ½ of a length of a channel of the fifth transistor or the sixth transistor.

In an embodiment, the third transistor may have a single structure.

In an embodiment, a width of the channel of the second transistor may be in a range of about 1 $\mu$m to about 2 $\mu$m, and a length of the channel of the second transistor may be in a range of about 1 $\mu$m to about 2.5 $\mu$m.

In an embodiment, the width of the channel of the second transistor may be in a range of ⅓ to ½ of a width of the channel of the first transistor.

In an embodiment, the length of the channel of the second transistor may be in a range of ⅓ to ½ of a length of a channel of the fifth transistor or the sixth transistor.

In an embodiment, the light emitting display device may further include a gate insulating film covering the polycrystalline semiconductor layer, where the gate insulating film may have a thickness value in a range of about 800 angstrom (Å) to about 1200 Å, where the thickness value may be a thickness of a silicon oxide film or a converted thickness of a double layer of a silicon nitride film and a silicon oxide film to a thickness of a single layer of a silicon oxide film In an embodiment, the light emitting display device may be driven even at a low frequency of 60 Hz or less.

Another embodiment provides a display device including: a substrate; a semiconductor layer disposed on the substrate, where the semiconductor layer includes a polycrystalline semiconductor; a first gate insulating film covering the semiconductor layer; a first gate conductor disposed on the first gate insulating film; a second gate insulating film covering the first gate conductor and the first gate insulating film; a second gate conductor disposed on the second gate insulating film; an interlayer insulating film covering the second gate conductor and the second gate insulating film; a data conductor disposed on the interlayer insulating film; and a passivation film covering the data conductor and the interlayer insulating film. In such an embodiment, the first gate insulating film may have a thickness value in a range of about 800 Å to about 1200 Å, where the thickness value is a thickness of a silicon oxide film or a converted thickness of a double layer of a silicon nitride film and a silicon oxide film to a thickness of a single layer of a silicon oxide film.

In an embodiment, the first gate insulating film may be a single film of a silicon oxide film.

In an embodiment, the first gate insulating film may include a silicon oxide film disposed on the semiconductor layer, and a silicon nitride film disposed on the silicon oxide film.

In an embodiment, a length of a channel of a transistor defined by a portion of the semiconductor layer may be in a range of about 1 µm to about 2.5 µm.

Another embodiment provides a manufacturing method of a light emitting display device, including: forming amorphous silicon on a substrate; cleaning the amorphous silicon; crystallizing the amorphous silicon by irradiating the amorphous silicon with a laser; and plasma-treating a surface of a crystallized semiconductor with hydrogen.

In an embodiment, the cleaning the amorphous silicon may include: cleaning the amorphous silicon with ozone; and further cleaning the amorphous silicon with hydrogen fluoride (HF), where a silicon oxide film formed on a surface of the amorphous silicon may be removed by the cleaning the amorphous silicon.

According to embodiments, at least some of transistors including a plurality of polycrystalline semiconductors included in a pixel are formed to have a predetermined channel size to allow a leakage current to occur at a predetermined amount or less, such that no flicker is viewed even when driven at a low frequency because display luminance does not decrease. In embodiments, by reducing a size of a protrusion formed when crystallizing a polycrystalline semiconductor, a leakage current is reduced, and thus no flicker is viewed even when driven at a low frequency. In embodiments, a gate insulating film covering a polycrystalline semiconductor is formed to be in a predetermined thickness range to reduce a leakage current, and thus no flicker is viewed even when driven at a low frequency.

BRIEF DESCRIPTION OF THE DRAWINGS

The above and other features of the invention will become more apparent by describing in further detail embodiments thereof with reference to the accompanying drawings, in which:

FIG. 19 illustrates a change of a channel length in a transistor including a polycrystalline semiconductor according to an embodiment.

DETAILED DESCRIPTION

Figure 1:
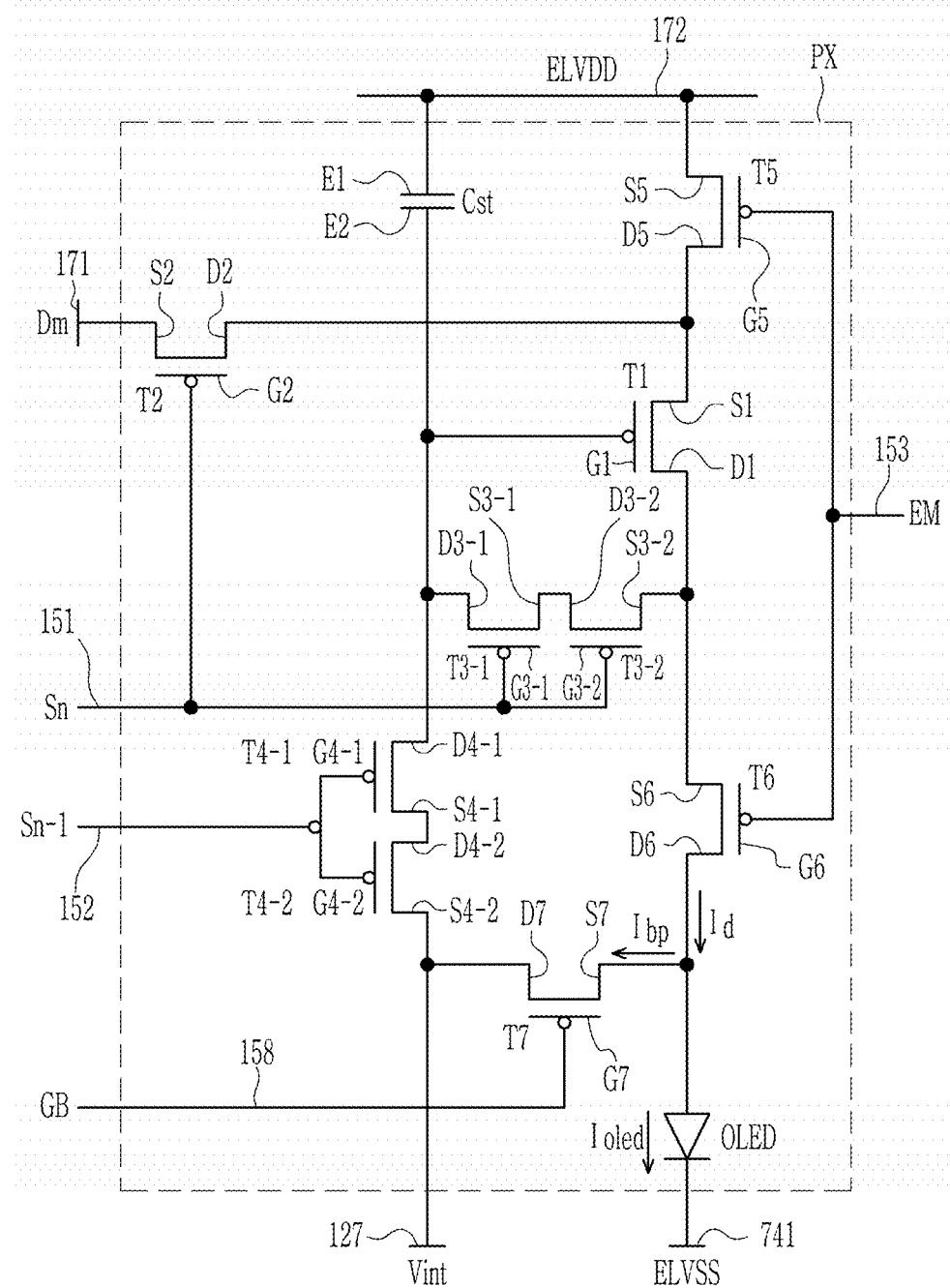
FIG. 1 illustrates an equivalent circuit diagram of a pixel of a light emitting display device according to an embodiment.

The invention will be described more fully hereinafter with reference to the accompanying drawings, in which various embodiments are shown. As those skilled in the art would realize, the described embodiments may be modified in various different ways, all without departing from the spirit or scope of the present disclosure.

Parts that are irrelevant to the description will be omitted to clearly describe the present disclosure, and like reference numerals designate like elements throughout the specification.

Further, in the drawings, the size and thickness of each element are arbitrarily illustrated for ease of description, and the present disclosure is not necessarily limited to those illustrated in the drawings. In the drawings, the thicknesses of layers, films, panels, regions, etc., are exaggerated for clarity. In the drawings, for ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "or" means "and/or."

As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Further, throughout the specification, the phrase "in a plan view" or "on a plane" means viewing a target portion from the top, and the phrase "in a cross-section" or "on a cross-section" means viewing a cross-section formed by vertically cutting a target portion from the side.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
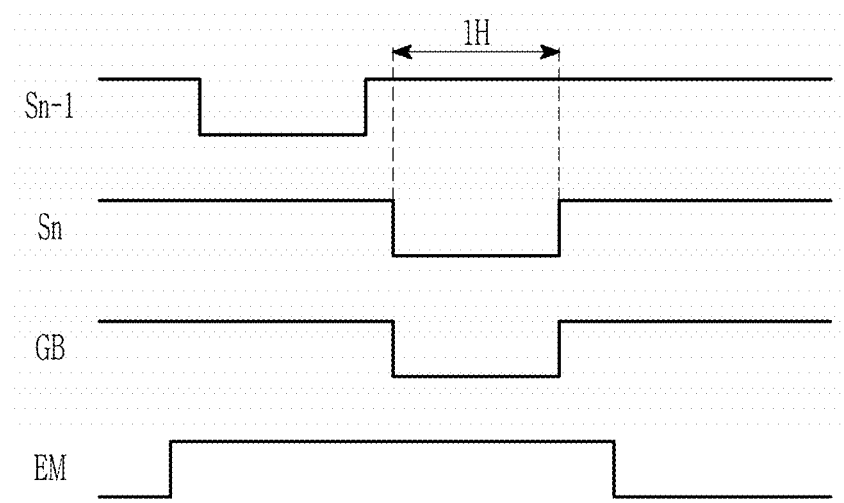
FIG. 2 illustrates a timing chart of a signal applied to a pixel of a light emitting display device according to an embodiment.

FIG. 1 illustrates an equivalent circuit diagram of a pixel of a light emitting display device according to an embodiment, and FIG. 2 illustrates a timing chart of a signal applied to a pixel of a light emitting display device according to an embodiment.

Referring to FIG. 1, in an embodiment, a pixel PX of a light emitting display includes a plurality of transistors T1, T2, T3, T4, T5, T6 and T7 connected to a plurality of signal lines 127, 151, 152, 153, 158, 171, 172 and 741, a storage capacitor Cst, and a light emitting diode OLED.

In an embodiment, at least one of the third transistor T3 and the fourth transistor T4 among the plurality of transistors T1, T2, T3, T4, T5, T6, and T7 may have a predetermined channel size for reducing a leakage current. In such an embodiment, a width of a channel of the third transistor T3 or the fourth transistor T4 may be in a range of about 1 micrometers (μm) to about 2 μm, and a length of the channel of the third transistor T3 or the fourth transistor T4 may be in a range of about 1 μm to about 2.5 μm. In such an embodiment, the width of the channel of the third transistor T3 or the fourth transistor T4 may be in a range of ⅓ to ½ of a width of a channel of a driving transistor T1. In such an embodiment, a length of the channel of the third transistor T3 or the fourth transistor T4 may be in a range of ⅓ to ½ of a length of the fifth transistor T5 or the sixth transistor T6. In an embodiment, the third transistor T3 or the fourth transistor T4 may be formed in a dual structure connected to each other to receive a same scan signal as each other.

Hereinafter, a structure of a pixel shown in FIG. 1 will be described in detail.

In an embodiment, the plurality of transistors T1, T2, T3, T4, T5, T6 and T7 include a first transistor (hereinafter, will be referred to as a driving transistor) T1, switching transistors, including a second transistor T2 and a third transistor T3, connected to a scan line (also referred to as a current scan line) 151, and the other transistors are transistors (hereinafter referred to as compensating transistors) for performing a driving operation of the light emitting diode OLED. The compensating transistors T4, T5, T6 and T7 may include a fourth transistor T4, a fifth transistor T5, a sixth transistor T6, and a seventh transistor T7.

The plurality of signal lines 127, 151, 152, 153, 158, 171, 172 and 741 may include the scan line 151, a previous scan line 152, a light emitting control line 153, a bypass control line 158, a data line 171, a driving voltage line 172, an initializing voltage line 127, and a common voltage line 741. The bypass control line 158 may be a portion of the previous scan line 152 or may be a line electrically connected thereto.

The scan line 151 is connected to a gate driver (not shown) to transmit a scan signal (also referred to as a current scan signal) Sn to the second transistor T2 and the third transistor T3. The previous scan line 152 is connected to the gate driver and transmits a previous scan signal Sn−1 to be applied to a previous pixel PX thereof (e.g., a pixel in a previous pixel row) to the fourth transistor T4. The light emitting control line 153 is connected to a light emitting controller (not shown) to transmit a light emitting control signal EM for controlling a light emitting time of the light emitting diode OLED to the fifth transistor T5 and the sixth transistor T6. The bypass control line 158 transmits a bypass signal GB to the seventh transistor T7.

The data line 171 is a wire for transmitting a data voltage Dm generated in the data driver (not shown), and luminance, at which the light emitting diode OLED (also referred to as the light emitting element) emits, varies in accordance with the data voltage Dm. The driving voltage line 172 applies a driving voltage ELVDD, the initializing voltage line 127 transmits an initializing voltage Vint for initializing the driving transistor T1, and the common voltage line 741 applies a common voltage ELVSS. Voltages applied to the driving voltage line 172, the initializing voltage line 127, and the common voltage line 741 may be constant.

Hereinafter, a plurality of transistors in a pixel will be described in detail.

In an embodiment, the driving transistor T1 is a transistor that adjusts an amount of a current outputted based on the applied data voltage Dm, and an outputted driving current Id is applied to the light emitting diode OLED to adjust brightness of the light emitting diode OLED based on the data voltage Dm. In such an embodiment, a first electrode S1 of the driving transistor T1 is connected to the driving voltage line 172 via the fifth transistor T5 to receive the driving voltage ELVDD. In such an embodiment, the first electrode S1 of the driving transistor T1 is connected to a second electrode D2 of the second transistor T2 to receive the data voltage Dm. A second electrode D1 (output side electrode) of the driving transistor T1 is connected to an anode of the light emitting diode via the sixth transistor T6 to output a current toward the light emitting diode OLED. In such an embodiment, a gate electrode G1 of the driving transistor T1 is connected to one electrode (second storage electrode E2) of the storage capacitor Cst. Accordingly, a voltage of the gate electrode G1 varies depending on a voltage stored in the storage capacitor Cst, thus the driving current Id outputted by the driving transistor T1 varies.

The second transistor T2 is a transistor for receiving the data voltage Dm into the pixel PX. A gate electrode G2 of the second transistor T2 is connected to the scan line 151, and a first electrode S2 of the second transistor T2 is connected to the data line 171. The second electrode D2 of the second transistor T2 is connected to the first electrode S1 of the driving transistor T1. When the second transistor T2 is turned on in response to the scan signal Sn transmitted through the scan line 151, the data voltage Dm transmitted through the data line 171 is transmitted to the first electrode S1 of the driving transistor T1.

The third transistor T3 is a transistor that allows a compensating voltage (a voltage of Dm+Vth) in which the data voltage Dm is changed while passing through the driving transistor T1 to be transmitted to a second storage electrode E2 of the storage capacitor Cst. Herein, Vth denotes a threshold voltage of the driving transistor T1. The third transistor T3 has a dual structure including a first third transistor T3-1 and a second third transistor T3-2. The first third transistor T3-1 and the second third transistor T3-2 are connected to a same scan line, i.e., the current scan line 151, and a first electrode S3-1 of the first third transistor T3-1 and a second electrode D3-2 of the second third transistor T3-2 are connected to each other, and a first electrode S3-2 of the second third transistor T3-2 is connected to the second electrode D1 of the driving transistor T1. A second electrode D3-1 of the first third transistor T3-1 is connected to the second storage electrode E2 of the storage capacitor Cst and the gate electrode G1 of the driving transistor T1. The third transistor T3 is turned on in response to the scan signal Sn received through the scan line 151 to connect the gate electrode G1 and the second electrode D1 of the driving transistor T1, and the third transistor T3 also connects the second electrode D1 of the driving transistor T1 and the second storage electrode E2 of the storage capacitor Cst.

The fourth transistor T4 serves to initialize the gate electrode G1 of the driving transistor T1 and the second storage electrode E2 of the storage capacitor Cst. The fourth transistor T4 has a dual structure including a first fourth transistor T4-1 and a second fourth transistor T4-2. The first fourth transistor T4-1 and the second fourth transistor T4-2 are connected to a same scan line, i.e., the previous scan line 152, and a first electrode S4-1 of the first fourth transistor T4-1 and a second electrode D4-2 of the second fourth transistor T4-2 are connected to each other. In addition, the first electrode S4-2 of the second fourth transistor T4-2 is connected to the initializing voltage line 127, and the second electrode D4-1 of the first fourth transistor T4-1 is connected to the second storage electrode E2 of the storage capacitor Cst and the gate electrode G1 of the driving transistor T1 via the second electrode D3 of the third transistor T3. The fourth transistor T4 transmits the initializing voltage Vint to the gate electrode G1 of the driving transistor T1 and the second storage electrode E2 of the storage capacitor Cst in response to the previous scan signal Sn−1 received through the previous second scan line 152. Thus, a gate voltage of the gate electrode G1 of the driving transistor T1 and the storage capacitor Cst are initialized. The initializing voltage Vint has a low voltage value, which may be a voltage capable of turning on the driving transistor T1.

The fifth transistor T5 serves to transmit the driving voltage ELVDD to the driving transistor T1. A gate electrode G5 of the fifth transistor T5 is connected to the light emitting control line 153, and a first electrode S5 of the fifth transistor T5 is connected to the driving voltage line 172. A second electrode D5 of the fifth transistor T5 is connected to the first electrode S1 of the driving transistor T1.

The sixth transistor T6 serves to transmit the driving current Id outputted from the driving transistor T1 to the light emitting diode OLED. A gate electrode G6 of the sixth transistor T6 is connected to the light emitting control line 153, and a first electrode S6 of the sixth transistor T6 is connected to the second electrode D1 of the driving transistor T1. A second electrode D6 of the sixth transistor T6 is connected to the anode of the light emitting diode OLED.

The fifth transistor T5 and the sixth transistor T6 are simultaneously turned on in response to the light emitting control signal EM received through the light emitting control line 153, and when the driving voltage ELVDD is applied to the first electrode S1 of the driving transistor T1 through the fifth transistor T5, the driving transistor T1 outputs the driving current Id corresponding to a voltage (i.e., a voltage of the second storage electrode E2 of the storage capacitor Cst) of the gate electrode S1 of the driving transistor T1. The outputted driving current Id from the driving transistor T1 is transmitted to the light emitting diode OLED through the sixth transistor T6. The light emitting diode OLED emits light as a current Ioled flows through the light emitting diode OLED.

The seventh transistor T7 serves to initialize the anode of the light emitting diode OLED. A gate electrode G7 of the seventh transistor T7 is connected to the bypass control line 158, a first electrode S7 of the seventh transistor T7 is connected to the anode of the light emitting diode OLED, and a second electrode D7 of the seventh transistor T7 is connected to the initializing voltage line 127. In an embodiment, the bypass control line 158 may be connected to the current scan line 151, and the bypass signal GB may be a same timing signal as the current scan signal Sn. Alternatively, the bypass control line 158 may not be connected to the current scan line 151, but may be connected to the previous scan line 152. When the seventh transistor T7 is turned on in response to the bypass signal GB, the initializing voltage Vint is applied to the anode of the light emitting diode OLED to initialize the anode of the light emitting diode OLED. According to an alternative embodiment, the seventh transistor T7 may be omitted.

The first storage electrode E1 of the storage capacitor Cst is connected to the driving voltage line 172, and the second storage electrode E2 of the storage capacitor Cst is connected to the gate electrode G1 of the driving transistor T1, the second electrode D3 of the third transistor T3, and the second electrode D4 of the fourth transistor T4. As a result, the second storage electrode E2 of the storage capacitor Cst determines the voltage of the gate electrode G1 of the driving transistor T1, and the second storage electrode E2 of the storage capacitor Cst receives the data voltage Dm through the second electrode D3 of the third transistor T3, or receives the initializing voltage Vint through the second electrode D4 of the fourth transistor T4.

In an embodiment, the anode of the light emitting diode OLED is connected to the second electrode D6 of the sixth transistor T6 and the first electrode S7 of the seventh transistor T7, and a cathode of the light emitting diode OLED is connected to the common voltage line 741 for transmitting the common voltage ELVSS.

In an embodiment, as shown in FIG. 1, the pixel circuit includes seven transistors T1 to T7 and a single capacitor Cst, but not being limited thereto. Alternatively, the number of the transistors, the number of the capacitors and connection structure therebetween may be variously changed or modified.

An operation of a pixel of the light emitting display device according to an embodiment will hereinafter be described with reference to FIG. 1 and FIG. 2.

A waveform illustrated in FIG. 2 may be a waveform applied at a normal frequency of 60 hertz (Hz), but may also be a waveform applied at a lower frequency (for example, a frequency of 30 Hz or less). In FIG. 2, 1H denotes one horizontal period. In an embodiment, the light emitting display device may be driven with a variable frequency such that an image may be displayed with a normal frequency and a low frequency depending on a displayed image or user's setting. In an embodiment of the invention, even when the light emitting display device displays an image with a low frequency, no flicker is viewed or recognized.

During an initialization period, the previous scan signal Sn−1 of a low level is supplied to the pixel PX through the second scan line 152. In the initialization period, the fourth transistor T4 to which the previous scan signal Sn−1 of the low level is applied is turned on, so that the initializing voltage Vint is applied to the gate electrode G1 of the driving transistor T1 and the second storage electrode E2 of the storage capacitor Cst through the fourth transistor T4. Accordingly, the driving transistor T1 and the storage capacitor Cst are initialized. Since the initializing voltage Vint is a low voltage, the driving transistor T1 is also turned on.

Thereafter, during a data writing period, the scan signal Sn of a low level is supplied to the pixel PX through the scan line 151. The second transistor T2 and the third transistor T3 are turned on by the scan signal Sn of the low level.

When the second transistor T2 is turned on, the data voltage Dm is inputted to the first electrode S1 of the driving transistor T1 through the second transistor T2.

During the initialization period, since the driving transistor T1 and the third transistor T3 are turned on by the initializing voltage Vint, the first electrode S1 of the driving transistor T1 may be electrically connected to the gate electrode G1 of the driving transistor T1 through the second electrode D1 of the driving transistor D1 and the third transistor T3. Therefore, the data voltage Dm transmitted to the first electrode S1 of the driving transistor T1 passes through the driving transistor T1 and the third transistor T3 to the gate electrode G1 of the driving transistor T1, then the data voltage Dm is stored in the second storage electrode E2 of the storage capacitor Cst.

During the initialization period, a voltage of the gate electrode G1 of the driving transistor T1 gradually increases by the data voltage Dm applied to the second storage electrode E2, and then a difference between a voltage of the gate electrode G1 and a voltage of the first electrode S1 is a threshold voltage (Vth), the driving transistor T1 is turned off, and a voltage of the gate electrode G1 at this time is stored and maintained in the second storage electrode E2 of the storage capacitor Cst. In this case, since the voltage of the first electrode S1 is the data voltage Dm, the voltage stored in the second storage electrode E2 of the storage capacitor Cst is a voltage obtained by subtracting the threshold voltage Vth of the driving transistor T1 from the data voltage Dm.

In an embodiment, during the writing period, the bypass signal GB of a low level is applied to the seventh transistor T7. The seventh transistor T7, to which the bypass signal GB of the low level is applied, is turned on, so that the initializing voltage Vint is applied to the anode of the light emitting diode OLED through the seventh transistor T7. As a result, the anode of the light emitting diode OLED is initialized.

Thereafter, during a light emitting period, since the light emitting control signal EM supplied from the light emitting control line 153 is at a low level, the fifth transistor T5 and the sixth transistor T6 are turned on. As a result, the driving voltage ELVDD is applied to the first electrode S1 of the driving transistor T1, and the second electrode D1 of the driving transistor T1 is connected to the light emitting diode OLED. An amount of the outputted driving current Id of the driving transistor T1 is determined based on a difference between the voltage of the gate electrode G1 and the voltage (that is, the driving voltage ELVDD) of the first electrode S1. A voltage of the gate electrode G1 is stored in the second storage electrode E2 of the storage capacitor Cst, and since the voltage is a voltage obtained by subtracting the threshold voltage Vth of the driving transistor T1 from the data voltage Dm, the amount of the outputted driving current Id of the driving transistor T1 corresponds to a voltage obtained by subtracting the data voltage Dm from the driving voltage ELVDD and then adding the threshold voltage (Vth).

Here, the threshold voltage (Vth) is a voltage used to turn on the driving transistor, and serves to compensate for characteristics of the driving transistor having various threshold voltages. In an embodiment, since the driving voltage ELVDD has a constant value in all pixels, the outputted driving current Id of the driving transistor is determined based on the remaining data voltage Dm.

Therefore, an output current of the driving transistor T1 is allowed to be constant even though the driving transistors T1 disposed in respective pixels PX have different threshold voltages (Vth) due to process dispersion, thereby improving non-uniformity of the characteristics thereof and effectively controlling the driving current Id to correspond to the applied data voltage Dm.

When the above-described light emitting period ends, a same operation is repeated from the initialization period.

One of the first electrode and the second electrode of each of the plurality of transistors T1, T2, T3, T4, T5, T6, and T7 may be a source electrode and the other thereof may be a drain electrode, depending on a direction in which a voltage or current is applied.

In an embodiment, while the seventh transistor T7 initializes the anode of the light emitting diode OLED in the initialization period, a small amount of current emitted under a condition, in which the driving transistor T1 is not actually turned on, is effectively from flowing toward the light emitting diode OLED. In this case, a small amount of current is discharged through the seventh transistor T7 to a terminal of the initializing voltage Vint stage as a bypass current Ibp. Accordingly, the light emitting diode OLED does not emit undesired light, so that a black gray may be displayed more clearly and a contrast ratio may be improved. In this case, the bypass signal GB may be a signal having different timing from that of the previous scan signal Sn−1. In an alternative embodiment, the seventh transistor T7 may be omitted.

Hereinafter, a pixel arrangement structure of a light emitting display device according to an embodiment will be described in detail with reference to FIG. 3 to FIG. 6.

Figure 3:
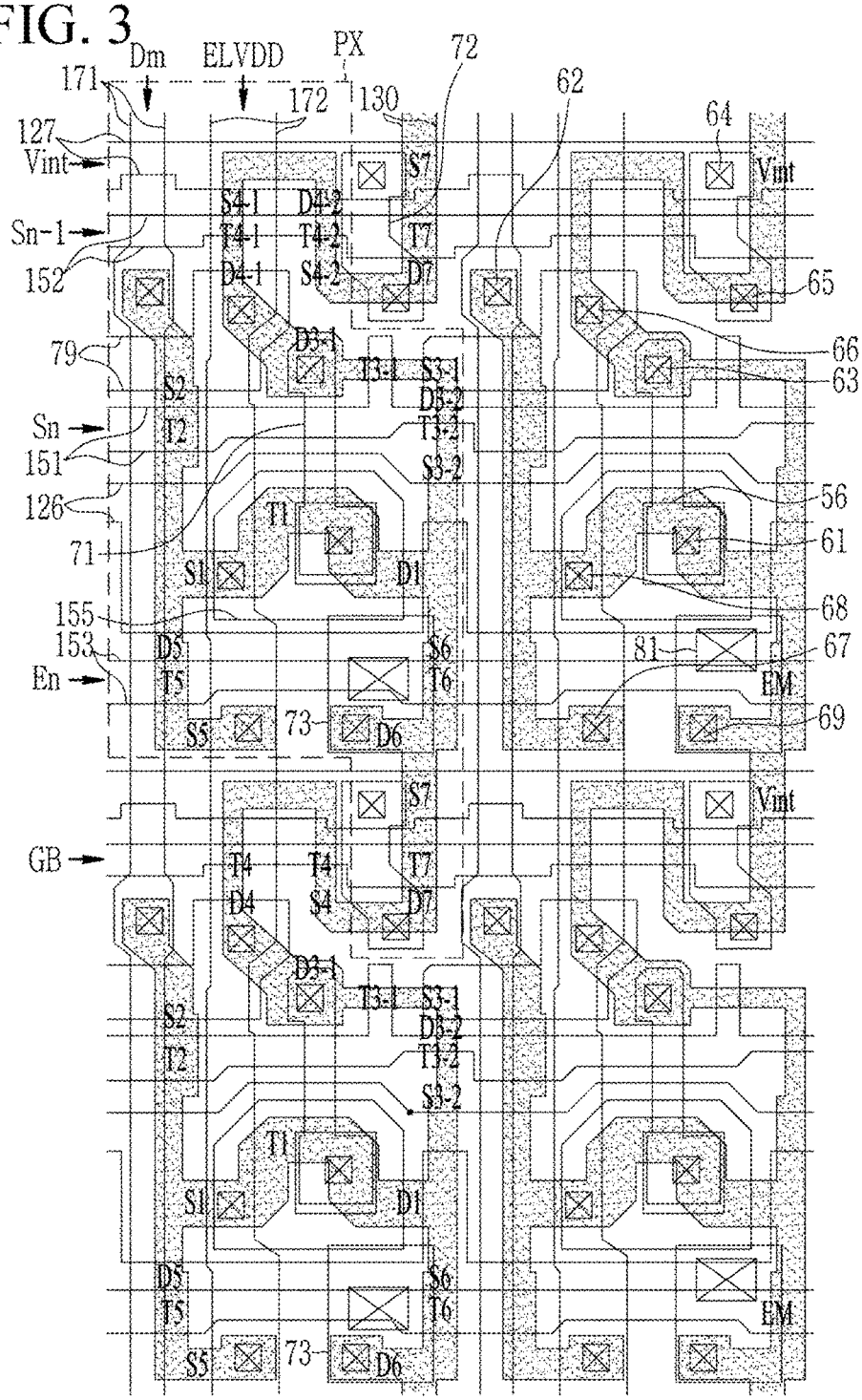
FIG. 3 illustrates a plan view of a pixel of a light emitting display device according to an embodiment.
Figure 4:
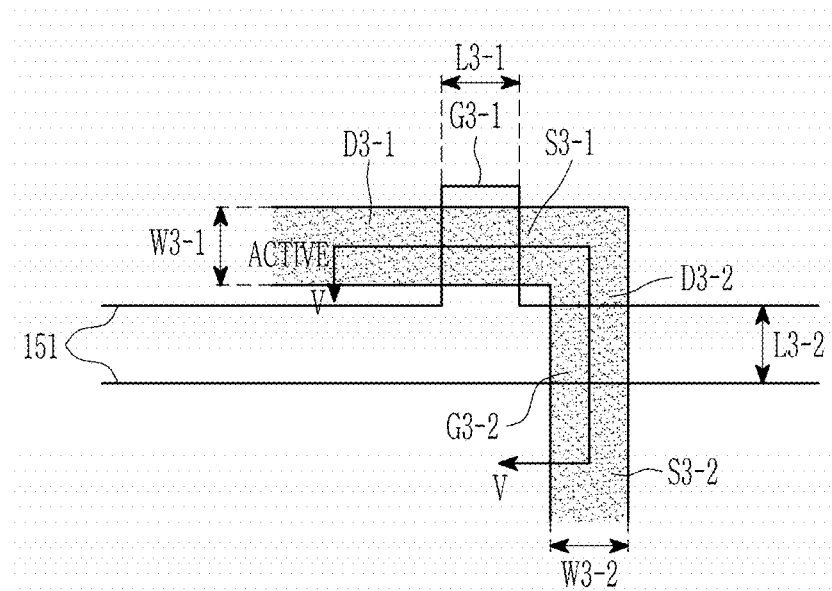
FIG. 4 illustrates an enlarged plan view of a third transistor of a light emitting display device according to an embodiment.
Figure 5:
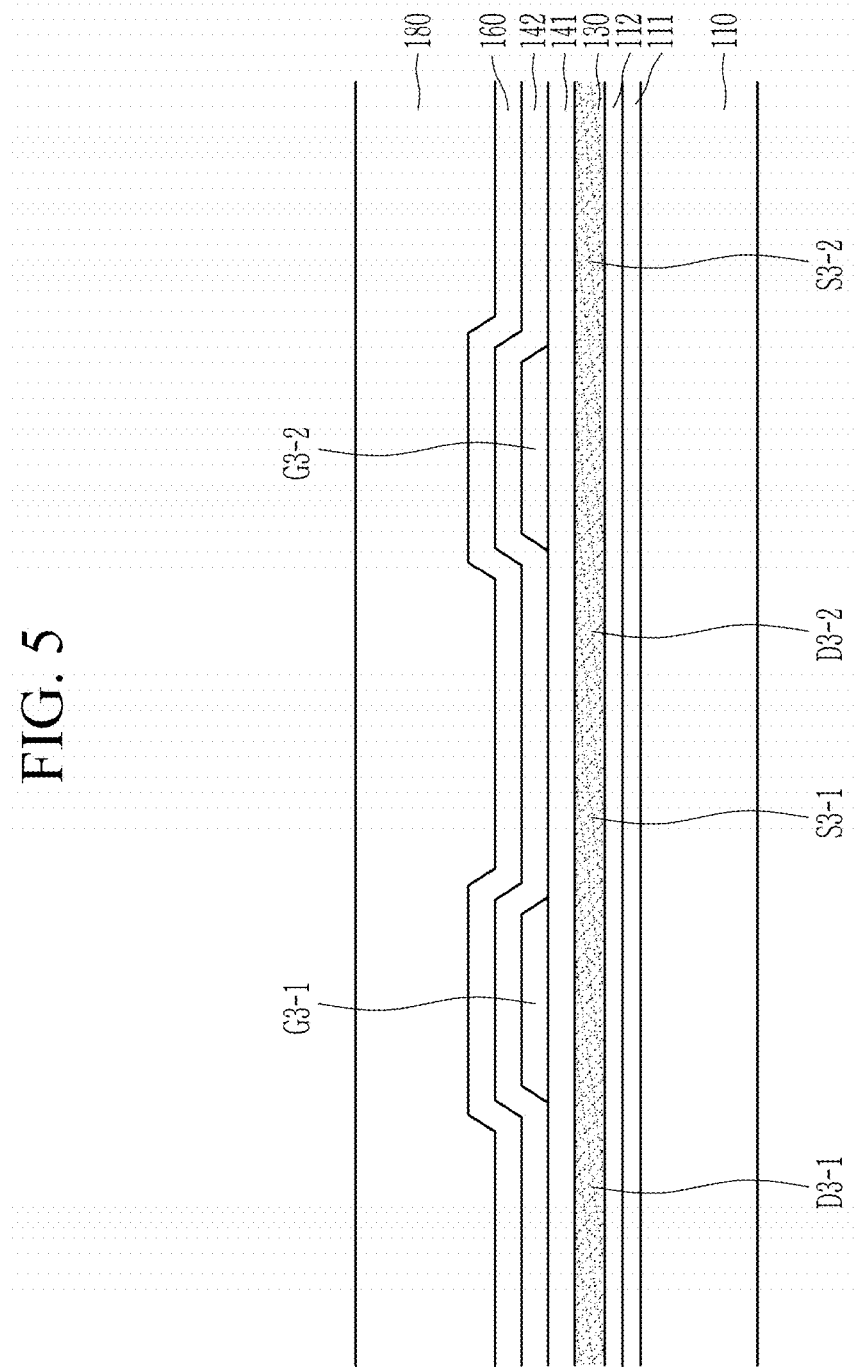
FIG. 5 illustrates a cross-sectional view taken along line V-V of FIG. 4.
Figure 6:
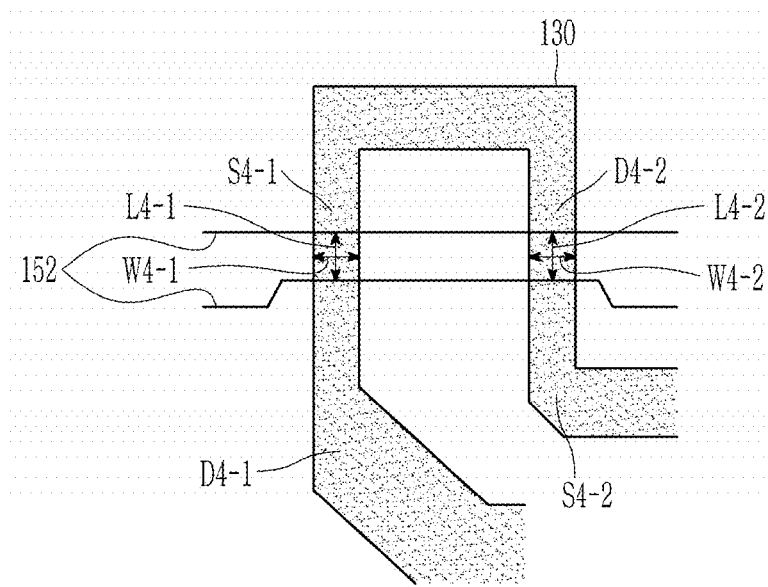
FIG. 6 the light an enlarged plan view of a fourth transistor of a light emitting display device according to an embodiment.

FIG. 3 illustrates a plan view of a pixel of a light emitting display device according to an embodiment, FIG. 4 illustrates an enlarged plan view of a third transistor of a light emitting display device according to an embodiment, FIG. 5 illustrates a cross-sectional view taken along line V-V of FIG. 4, and FIG. 6 the light an enlarged plan view of a fourth transistor of a light emitting display device according to an embodiment.

Referring to FIG. 3, an embodiment of the light emitting display device includes the scan line 151, the previous scan line 152, the light emitting control line 153, and the initializing voltage line 127, which substantially extend along a first direction (or a horizontal direction) and transmit the scan signal Sn, the previous scan signal Sn−1, the light emitting control signal EM, and the initializing voltage Vint, respectively. In an embodiment, the bypass signal GB may be transmitted through the previous scan line 152. The light emitting display device includes the data line 171 and the driving voltage line 172 that extend along a second direction (or a vertical direction) crossing the first direction and that transmit the data voltage Dm and the driving voltage ELVDD, respectively.

The light emitting display includes the driving transistor T1, the second transistor T2, the third transistor T3, the fourth transistor T4, the fifth transistor T5, the sixth transistor T6, the seventh transistor T7, the storage capacitor Cst, and the light emitting diode OLED.

The light emitting diode OLED includes a pixel electrode, a light emitting layer, and a common electrode.

In an embodiment, respective channels of the driving transistor T1, the second transistor T2, the third transistor T3, the fourth transistor T4, the fifth transistor T5, the sixth transistor T6, and the seventh transistor T7 are disposed in a semiconductor layer 130 shown in FIG. 5. In an embodiment, at least some of the first and second electrodes of the plurality of transistors T1, T2, T3, T4, T5, T6, and T7 are also disposed in the semiconductor layer 130. The semiconductor layer 130 (a portion in which a shading is added in FIG. 3, hereinafter the same) may be bent in various forms. In an embodiment, the semiconductor layer 130 includes or is formed of polysilicon. In such an embodiment, where the semiconductor layer 130 includes the polysilicon, a leakage current thereof may be large compared to other semiconductors, and thus a flicker may be viewed when driven at a low frequency. In an embodiment of the invention, a leakage current is reduced by adjusting a channel size of the third transistor T3 or the fourth transistor T4 to enable low-frequency driving. As a result, since a separate semiconductor layer such as an oxide semiconductor may not be further formed such that manufacturing time and costs of the light emitting display device are substantially reduced.

In an embodiment, the semiconductor layer 130 may be formed by doping N-type impurities or P-type impurities into polysilicon, and the semiconductor layer 130 includes a channel in which impurities are not doped, and first and second doped regions at respective sides of the channel are doped with impurities. The first doped region and the second doped region correspond to the first and second electrodes of the plurality of transistors T1, T2, T3, T4, T5, T6, and T7, respectively. In an embodiment, and one of the first doped region and the second doped region is a source region, and the other of the first doped region and the second doped region corresponds to a drain region. In an embodiment, regions of the semiconductor layer 130 between the first and second electrodes of two different transistors are also doped, so that the two transistors may be electrically connected to each other.

Each of the channels of the plurality of transistors T1, T2, T3, T4, T5, T6, and T7 overlaps the gate electrode of each of the transistors T1, T2, T3, T4, T5, T6, and T7, and is positioned between the first electrode and the second electrode of each of the transistors T1, T2, T3, T4, T5, T6, and T7. In an embodiment, when the semiconductor layer 130 is doped, after a gate electrode is formed, a doping process is performed using the gate electrode as a mask to reduce the cost without using an additional mask. The plurality of transistors T1, T2, T3, T4, T5, T6, and T7 may have substantially the same stacked structure as each other. Hereinafter, the driving transistor T1 will be mainly described in detail, and any repetitive detailed description of the remaining transistors T2, T3, T4, T5, T6, and T7 will be omitted or simplified.

The driving transistor T1 includes a channel, a gate electrode 155, a first electrode S1, and a second electrode D1. The channel of the driving transistor T1 is between the first electrode S1 and the second electrode D1, and overlaps the gate electrode 155 in a plan view. The channel is curved to increase a length thereof in a limited region. A driving range of the gate voltage Vg applied to the gate electrode 155 of the driving transistor T1 is widened as a length of the channel increases, and the driving current Id steadily increases in accordance with the gate voltage Vg. Accordingly, a gray of light emitted from the light emitting diode OLED may be finely controlled by changing the gate voltage Vg, and the display quality of the light emitting display device may also be improved. In such an embodiment, since the channel extends in several directions rather than extending in one direction, effects due to directionality are offset in a manufacturing process, thereby reducing an effect of process dispersion. Therefore, degradation in image quality such as spot defects that may occur due to the characteristic of the driving transistor T1 which varies according to the region of the display device due to the process dispersion (for example, a luminance difference occurring depending on pixels even if a same data voltage Dm is applied) may be effectively prevented. The shape of the channel is not limited to those shown in the figures, e.g., horseshoe shape (Ω shape), and the shapes of the channel may be variously modified.

In an embodiment, the gate electrode 155 overlaps the channel in a plan view. The first and second electrodes S1 and S2 are disposed at opposite sides of the channel. An extended portion of a storage line 126 is isolated and disposed on the gate electrode 155. The extended portion of the storage line 126 overlaps the gate electrode 155 with a second gate insulating film therebetween in a plan view to form the storage capacitor Cst. The extended portion of the storage line 126 defined a first electrode (E1 of FIG. 1) of the storage capacitor Cst, and the gate electrode 155 defines a second storage electrode (E2 of FIG. 1). An opening 56 is defined or formed through the extended portion of the storage line 126 so that the gate electrode 155 may be connected to a first data connecting member 71 through the opening 56. In the opening 56, an upper surface of the gate electrode 155 and the first data connecting member 71 are electrically connected through a contact hole 61. The first data connecting member 71 is connected to the second electrode D3 of the third transistor T3 to connect the gate electrode 155 of the driving transistor T1 and the second electrode D3 of the third transistor T3.

The gate electrode of the second transistor T2 may be defined by a portion of the scan line 151. The data line 171 is connected to the first electrode of the second transistor T2 through a contact hole 62, and the first electrode S2 and the second electrode D2 may be disposed on the semiconductor layer 130. Here, the width and length of the channel of the second transistor T2 may be about 3.0 μm and about 4.4 μm respectively, and may be larger or smaller than these values based on allowable errors.

In an embodiment, the third transistor T3 is formed with or collectively defined by two transistors T3-1 and T3-2 adjacent to each other to have a dual structure. The two transistors T3-1 and T3-2 are combined to serve as the third transistor T3. Gate electrodes G3-1 and G3-2 of the first third transistor T3-1 and the second third transistor T3-2 are disposed or formed on a same scan line 151, and the first electrode S3-1 of the first third transistor T3-1 and the second electrode D3-2 of the second third transistor T3-2 are connected to each other. In such an embodiment, the first electrode S3-2 of the second third transistor T3-2 is connected to the second electrode D1 of the driving transistor T1 and the first electrode S6 of the sixth transistor T6 through the semiconductor layer 130, and the second electrode D3-1 of the first third transistor T3-1 is connected to the gate electrode G1 of the driving transistor T1 through the data connecting member 71 connected through a contact hole 63.

Although the leakage current may be partially reduced through the dual structure, since a flicker may still be viewed when driven at a low frequency, it is desired to adjust a size of the channel of the third transistor T3 as described below.

Referring to FIG. 4 and FIG. 5, the structure of the third transistor and the size of the channel will be described in greater detail.

The gate electrode G3-1 of the first third transistor T3-1 is defined by a portion protruding upward from the scan line 151, and the gate electrode G3-2 of the second third transistor T3-2 is defined by a portion of the scan line 151. The channel of the first third transistor T3-1 is an area overlapping the gate electrode G3-1 on the semiconductor layer 130 in a plan view, and the channel of the second third transistor T3-2 is an area overlapping the gate electrode G3-2 on the semiconductor layer 130 in a plan view.

In an embodiment, as shown in FIG. 3, the widths of the overlapping semiconductor layer 130 and scan line 151 is reduced to form the channels of the first third transistors T3-1 and the second third transistors T3-2. As a result, the width and the length of the channels of the first third transistor T3-1 and the second third transistor T3-2 may be in a range of about 1 μm to about 2 μm, and in a range of about 1 μm to about 2.5 μm, respectively. In FIG. 4, the width and the length of the channels of the first third transistor T3-1 are labeled as W3-1 and L3-1, respectively, and the width and the length of the channels of the second third transistor T3-2 are labeled as W3-2 and L3-2, respectively.

In an embodiment, the first third transistor T3-1 and the second third transistor T3-2 are formed to have a same size as each other. In such an embodiment, the widths W3-1 and W3-2 of the first third transistor T3-1 and the second third transistor T3-2 may be about 1.5 μm, and the lengths L3-1 and L3-2 thereof may be about 1.5 μm. These are sizes reduced by about 1 μm or more than that of a channel of a conventional third transistor (i.e., a transistor having a same function as the third transistor T3 in a conventional display device), as a width and a length of a channel of the conventional third transistor, which has a large leakage current, are typically about 2.5 μm and about 3.25 μm, respectively, for example.

As described above, in an embodiment of the invention, where a polycrystalline semiconductor is used, the size of the channel of the third transistor T3 may be determined as described below such that the leakage current of the third transistor T3 is effectively controlled to prevent a flicker from being viewed or recognized.

In such an embodiment, the width of the channel of the third transistor T3 may be in a range of about 1 μm to about 2 μm, and the length of the channel of the third transistor T3 may be in a range of about 1 μm to about 2.5 μm. In such an embodiment, the width of the channel of the third transistor T3 may be in a range of ⅓ to ½ of the width of the channel of the driving transistor T1, and the length of the channel of the third transistor T3 may be in a range of ⅓ to ½ of the length of the channel of the fifth transistor T5 or the sixth transistor T6.

In such an embodiment, the size of the channel as described above is determined to allow a leakage current to be an amount to which no flicker is viewed, which will be described later in greater detail with reference to FIG. 10 to FIG. 16.

The fourth transistor T4 includes two transistors T4-1 and T4-2 to have a dual structure. The two transistors T4-1 and T4-2 are combined to serve as the fourth transistor T4. Gate electrodes G4-1 and G4-2 of the first fourth transistor T4-1 and the second fourth transistor T4-2 are disposed or formed on a same previous scan line 152, and the first electrode S4-1 of the first fourth transistor T4-1 and the second electrode D4-2 of the second fourth transistor T4-2 are connected to each other. In such an embodiment, the second electrode D4-1 of the first fourth transistor T4-1 is connected to the gate electrode G1 of the driving transistor T1 through the first data connecting member 71 connected through the contact hole 63, and the first electrode S4-2 of the second fourth transistor T4-2 is connected to the initializing voltage line 127 through a second data connecting member 72 connected through a contact hole 65.

Referring to FIG. 6, which is an enlarged view of the fourth transistor T4, the first and second fourth transistors T4-1 and T4-2 are disposed or formed in a portion where the previous scan line 152 overlaps the semiconductor layer 130, and the semiconductor layer 130 has a structure that extends upward, extends in one direction, then extends downward again, that is, meets the previous scan line 152 twice.

In an embodiment, as shown in FIG. 6, the width of portions of the overlapping semiconductor layer 130 and previous scan line 152 is reduced to define the channels of the first fourth transistors T4-1 and the second fourth transistors T4-2. As a result, the width and the length of the channels of the first fourth transistor T4-1 and the second fourth transistor T4-2 may be in a range of about 1 μm to about 2 μm, and in a range of about 1 μm to about 2.5 μm, respectively.

Although the leakage current may be partially reduced by a simply dual structure, since a flicker may still be viewed when driven at a low frequency, it is necessary to adjust a size of the channel of the fourth transistor T4.

The channels of the first fourth transistors T4-1 and the second fourth transistors T4-2 are areas in which the previous scan line 152 overlaps the semiconductor layer 130 in a plan view. In FIG. 6, the width and the length of the channels of the first fourth transistor T4-1 are labeled as W4-1 and L4-1, respectively, and the width and the length of the channels of the second fourth transistor T4-2 are labeled as W4-2 and L4-2, respectively.

In an embodiment, the first fourth transistor T4-1 and the second fourth transistor T4-2 are formed to have a same size as each other. In such an embodiment, the widths W4-1 and W4-2 of the first fourth transistor T4-1 and the second fourth transistor T4-2 are formed to be about 1.5 μm, and the lengths L4-1 and L4-2 of the first fourth transistor T4-1 and the second fourth transistor T4-2 are also formed to be about 1.5 μm. These are sizes reduced by 1 μm than that of a channel of a conventional fourth transistor (i.e., a transistor having a same function as the fourth transistor T4 in a conventional display device), as a width and a length of a channel of the conventional fourth transistor, which has a large leakage current, are typically about 2.5 μm and about 3.25 μm, respectively, for example.

As described above, in an embodiment of the invention, where a polycrystalline semiconductor is used, the size of the channel of the fourth transistor T4 may be determined as described below such that the leakage current of the fourth transistor T4 is effectively controlled to prevent a flicker from being viewed or recognized.

In an embodiment, the channel width of the fourth transistor T4 may be in a range of about 1 μm to about 2 μm, and the channel length of the fourth transistor T4 may be in a range of about 1 μm to about 2.5 μm. In such an embodiment, the width of the channel of the fourth transistor T4 may be ⅓ to ½ of the width of the channel of the driving transistor T1. A length of the channel of the fourth transistor T4 may be ⅓ to ½ of the length of the fifth transistor T5 or the sixth transistor T6.

In an embodiment, the channels of the third transistor T3 and the fourth transistor T4 may have a same size as each other. Alternatively, the channels of the third transistor and the fourth transistor may have different sizes from each other, and only one of the third transistor T3 and the fourth transistor T4 may be in the above described range, which may be determined based on a degree of a driving frequency. In an embodiment, where the channels of the third and fourth transistors are formed to have the above escribed sizes, a leakage current reduction effect is further improved, thus a flicker may not be viewed or recognized even at a low frequency.

A criterion for determining the size of the channel as described above is to allow a leakage current to be an amount for preventing flicker from being viewed, which will be described in greater detail with reference to FIG. 10 to FIG. 16.

The gate electrode of the fifth transistor T5 may be defined by a portion of the light emitting control line 153. The driving voltage line 172 is connected to the first electrode S5 of the fifth transistor T5 through a contact hole 67, and the second electrode D5 is connected to the first electrode S1 of the driving transistor T1 through the semiconductor layer 130.

The gate electrode of the sixth transistor T6 may be defined by a portion of the light emitting control line 153. A third data connecting member 73 is connected to the second electrode D6 of the sixth transistor T6 through a contact hole 69, and the first electrode S6 is connected to the second electrode D1 of the driving transistor through the semiconductor layer 130.

The gate electrode of the seventh transistor T7 may be defined by a portion of the previous scan line 152. The third data connecting member 73 is connected to the first electrode S7 of the seventh transistor T7 through a contact hole 81, and the second electrode is connected to the first electrode S4 of the fourth transistor T4.

The storage capacitor Cst includes the first storage electrode E1 and the second storage electrode E2 which overlap each other with a second gate insulating film 142 therebetween. The second storage electrode E2 corresponds to the gate electrode 155 of the driving transistor T1, and the first storage electrode E1 may be defined by the extended portion of the storage line 126. In such an embodiment, the second gate insulating film 142 becomes a dielectric, and a capacitance is determined by a charge stored in the storage capacitor Cst and a voltage difference between the first and second storage electrodes E1 and E2. In such an embodiment, the gate electrode 155 may function as the second storage electrode E2, such that a the storage capacitor Cst may be effectively provided or disposed in a limited space that is narrowed by the channel of the driving transistor T1 occupying a large area in the pixel.

The driving voltage line 172 is connected to the first storage electrode E1 through a contact hole 68. Accordingly, the storage capacitor Cst stores a charge corresponding to a difference between the driving voltage ELVDD transmitted to the first storage electrode E1 through the driving voltage line 172 and the gate voltage Vg of the gate electrode 155.

The second data connecting member 72 is connected to the initializing voltage line 127 through a contact hole 64. An electrode or a pixel electrode is connected to the third data connecting member 73 through the contact hole 81.

A parasitic capacitor control pattern 79 of the two transistors T3-1 and T3-2 of the third transistor T3 having the dual structure may be disposed. A parasitic capacitor exists in the pixel, and image quality characteristics may change when the voltage applied to the parasitic capacitor is changed. The driving voltage line 172 is connected to the parasitic capacitor control pattern 79 through a contact hole 66, such that the image quality characteristic may be effectively prevented from being changed by applying the driving voltage ELVDD, which is a constant direct current ("DC") voltage, to the parasitic capacitor. A position of the parasitic capacitor control pattern 79 may be variously modified to be different from that shown in FIG. 3, and a voltage other than the driving voltage ELVDD may be applied. Alternatively, the parasitic capacitor control pattern 79 may be omitted Hereinafter, a sectional structure of the light emitting display device according to an embodiment will be described with reference to FIG. 3 and FIG. 5.

An embodiment of the light emitting display device includes a substrate 110, e.g., a rigid substrate such as a glass substrate or a substrate including a flexible material such as plastic or polyimide ("PI"). A barrier layer 111 is disposed on the substrate 110, and a buffer layer 112 is disposed on the barrier layer 111. The barrier layer 111 and the buffer layer 112 may include an inorganic insulating material such as a silicon oxide, a silicon nitride, or an aluminum oxide, and may also include an organic insulating material such as a polyimide acrylic (epoxy added).

The semiconductor layer 130 that includes the channels of the plurality of transistors T1, T2, T3, T4, T5, T6, and T7, the first electrode, and the second electrode and is made of polysilicon is disposed on the buffer layer 112. A first gate insulating film 141 is disposed on the semiconductor layer 130.

Figure 20A:
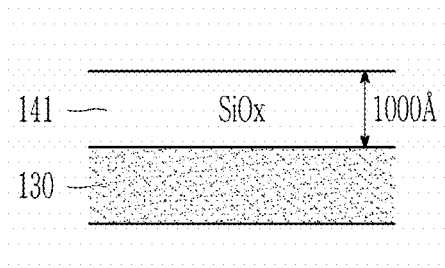
FIGS. 20A and 20B illustrate cross-sectional views of a first gate insulating film according to embodiments.
Figure 20B:
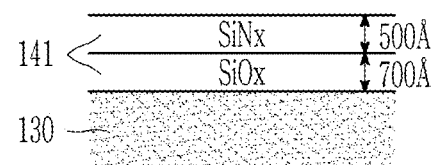

In an embodiment, as illustrated in FIGS. 20A and 20B, the first gate insulating film 141 may be a single layer of a silicon oxide (SiOx) or a double layer in which a silicon nitride (SiNx) is disposed on a silicon oxide (SiOx). In an embodiment, a thickness of the first gate insulating film 141 may be in a range of about 800 angstrom (Å) to about 1200 Å, which may be a value (800 Å to 1200 Å) obtained by converting a double layer into a thickness of a single layer of a silicon oxide film (SiOx) by Equation 1 to be described later with reference to FIGS. 20A and 20B.

A first gate conductor including the gate electrodes (second storage electrodes E2) of the plurality of transistors T1, T2, T3, T4, T5, T6, and T7, the scan line 151, the previous scan line 152, and the light emitting control line 153 is disposed on the first gate insulating film 141. The second gate insulating film 142 covering the first gate conductor is disposed on the first gate conductor. The first gate insulating film 141 and the second gate insulating film 142 may include or be made of a material such as a silicon nitride, a silicon oxide, or an aluminum oxide. A second gate conductor including the storage line 126, the first storage electrode E1, the initializing voltage line 127, and the parasitic capacitor control pattern 79 is disposed on the second gate insulating film 142.

An interlayer insulating film 160 covering the third gate conductor is disposed on the third gate conductor. The interlayer insulating film 160 may include or be made of a material such as a silicon nitride, a silicon oxide, and an aluminum oxide, or may include or be made of an organic insulating material. A data conductor including the data line 171, the driving voltage line 172, the first data connecting member 71, the second data connecting member 72, and the third data connecting member 73 is disposed on the interlayer insulating film 160.

A passivation film 180 covering the data conductor is disposed on the data conductor. The passivation layer 180, also referred to as a planarization layer, may include an organic insulating material. A pixel electrode (not shown) is disposed on the passivation film 180. The pixel electrode is connected to the third data connecting member 73 through the contact hole 81 defined through the passivation film 180. A partition wall (not shown) is disposed on the passivation film 180 and the pixel electrode. An open portion is defined through the partition wall to overlap the pixel electrode, and a light emitting layer is disposed in the open portion. A common electrode (not shown) is disposed on the light emitting layer and the partition wall. The pixel electrode, the light emitting layer, and the common electrode form the light emitting diode OLED.

In an embodiment, the pixel electrode may be an anode which is a hole injection electrode, and the common electrode may be a cathode which is an electron injection electrode. Alternatively, the pixel electrode may be a cathode, and the common electrode may be an anode. When holes and electrons are injected into the light emitting layer from the pixel electrode and the common electrode, respectively, light is emitted when excitons in which the injected holes and electrons are combined enter a ground state from an excited state. Here, the light emitting layer may be an organic light emitting layer including an organic material or an inorganic light emitting layer including an inorganic material.

The scan line 151, the previous scan line 152, and the light emitting control line 153, which are defined by portions of the first gate conductor, extend in the horizontal direction, and the storage line 126 and the initializing voltage line 127, which are defined by portions of the second gate conductor, also extend in the horizontal direction. In an embodiment, the data line 171 and the driving voltage line 172, which are defined by portions of the data conductor, extend in the vertical direction.

The data line 171 is connected to the first electrode of the second transistor T2 through the contact hole 62 defined through the first gate insulating film 141, the second gate insulating film 142, and the interlayer insulating film 160.

The driving voltage line 172 is connected to the first electrode S5 of the fifth transistor T5 through the contact hole 67 defined through the first gate insulating film 141, the second gate insulating film 142, and the interlayer insulating film 160, is connected to the extended portion of the storage line 126 (first storage electrode E1) through the contact hole 68 defined through the interlayer insulating film 160, and is connected to the parasitic capacitor control pattern 79 through the contact hole 66 defined through the interlayer insulating film 160.

One end of the first data connection member 71 is connected to the gate electrode 155 through the contact hole 61 defined through the second gate insulating film 142 and the interlayer insulating film 160, and the other end of the first data connection member 71 is connected to the second electrode D4 of the third transistor T3 and the second electrode D4 of the fourth transistor T4 through the contact hole 63 defined through the first gate insulating film 141, the second gate insulating film 142, and the interlayer insulating film 160.

One end of the second data connection member 72 is connected to the first electrode S4 of the fourth transistor T4 through the contact hole 65 defined through the first gate insulating film 141, the second gate insulating film 142, and the interlayer insulating film 160, and the other end of the second data connection member 72 is connected to the initializing voltage line 127 through the contact hole 64 defined through the interlayer insulating film 160.

The third data connection member (not shown, see reference numerical 73 of FIG. 8) is connected to the second electrode of the sixth transistor T6 through the contact hole 69 defined through the first gate insulating film 141, the second gate insulating film 142, and the interlayer insulating film 160.

Although not shown, an encapsulation layer (not shown) for protecting the light emitting diode OLED is disposed on the common electrode. The encapsulation layer may be in contact with the common electrode, or may be spaced apart from the common electrode. The encapsulation layer may be a thin film encapsulation layer in which an inorganic film and an organic film are stacked one on another. In one embodiment, for example, the encapsulation layer may be a triple layer of an inorganic film, an organic film, and an inorganic film. A capping layer and a functional layer may be disposed between the common electrode and the encapsulation layer.

In an embodiment, a touch electrode may be disposed on the encapsulation layer so that a touch may be detected.

In an embodiment, the sizes of the channels of the third transistor and the fourth transistor having the dual structure may be adjusted or determined as described above. Hereinafter, an embodiment including a third transistor defined by a single transistor will be described in detail with reference to FIG. 7 to FIG. 9.

Figure 7:
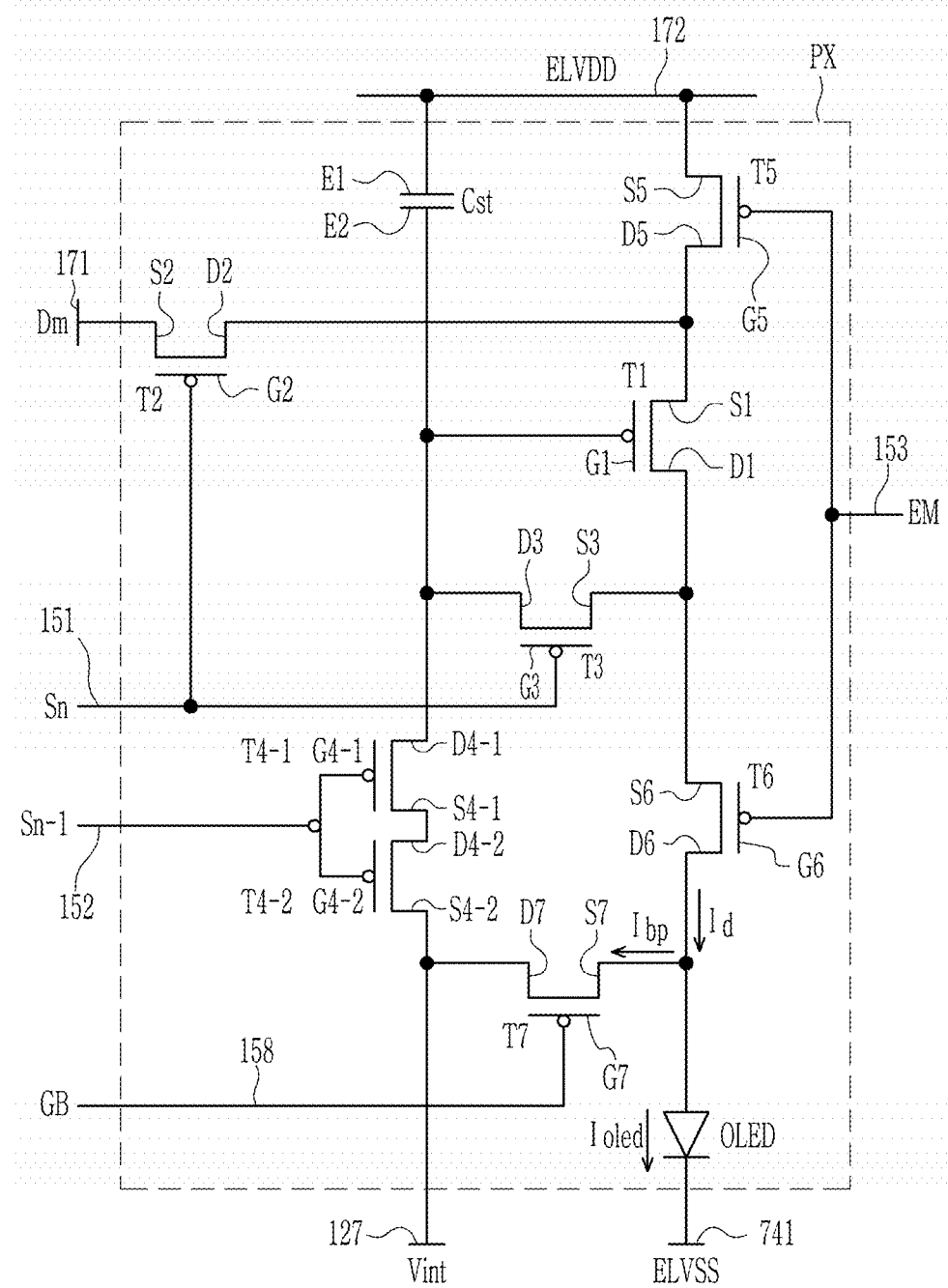
FIG. 7 illustrates an equivalent circuit diagram of a pixel of a light emitting display device according to an alternative embodiment.

FIG. 7 illustrates an equivalent circuit diagram of a pixel of a light emitting display device according to an alternative embodiment.

The circuit diagram in FIG. 7 is substantially the same as the circuit diagram shown in FIG. 1 except for the third transistor T3. The same or like elements shown in FIG. 7 have been labeled with the same reference characters as used above to describe the embodiments of the pixel of a light emitting display device shown in FIG. 1, and any repetitive detailed description thereof will hereinafter be omitted or simplified.

In an embodiment, as shown in FIG. 7, the third transistor T3 may be defined by a single transistor.

In such an embodiment, the size of the channel of the third transistor T3 may be changed from those of the embodiment of FIG. 1, and in addition, the size of the channel of the second transistor T2 or the fourth transistor T4 may also be changed as follows.

In an embodiment, the width of the channel of the third transistor T3 having a single structure among the plurality of transistors T1, T2, T3, T4, T5, T6, and T7 may be in a range of about 1 μm to about 2 μm, and the length of the channel of the third transistor T3 is in a range of about 1 μm to about 2.5 μm. In such an embodiment, the width of the channel of the fourth transistor T4 having the dual structure may be in a range of about 1 μm to about 2 μm, and the length of the channel of the fourth transistor T4 may be in a range of about 1 μm and about 2.5 μm. In such an embodiment, the width of the channel of the third transistor T3 or the fourth transistor T4 may be in a range of ⅓ to ½ of a width of a channel of the driving transistor T1. A length of the channel of the third transistor T3 or the fourth transistor T4 may be in a range of ⅓ to ½ of a length of the fifth transistor T5 or the sixth transistor T6.

In an embodiment, the width of the channel of the second transistor T2 may be in a range of about 1 μm to about 2 μm, and the length of the channel of the second transistor T2 may be in a range of about 1 μm and about 2.5 μm. In such an embodiment, the width of the channel of the second transistor T2 may be in a range of ⅓ to ½ of the width of the channel of the driving transistor T1, and the length of the channel of the second transistor T2 may be in a range of about ⅓ to ½ of the length of the channel of the fifth transistor T5 or the sixth transistor T6.

Figure 8:
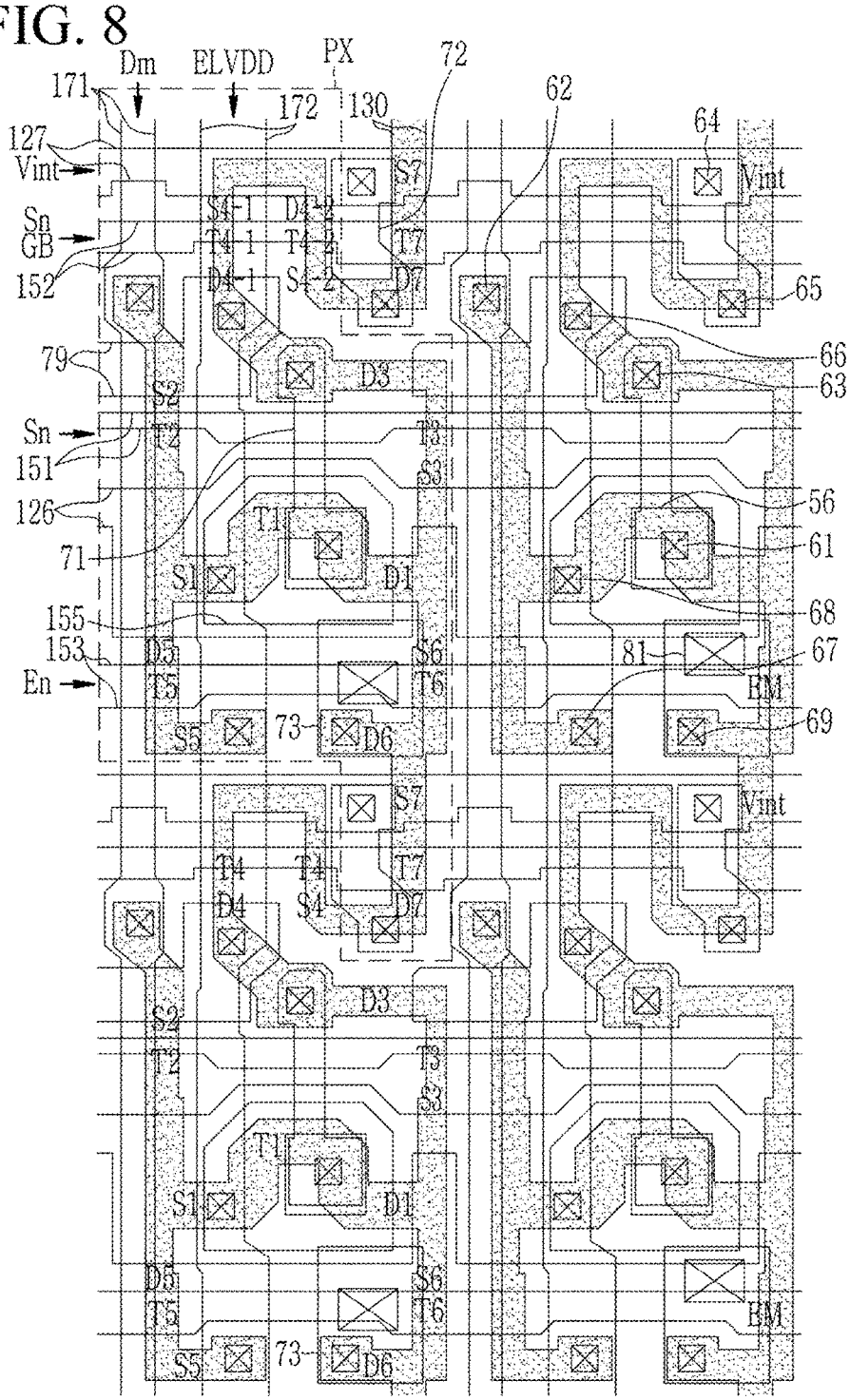
FIG. 8 illustrates a plan view of a pixel of a light emitting display device according to an alternative embodiment.
Figure 9:
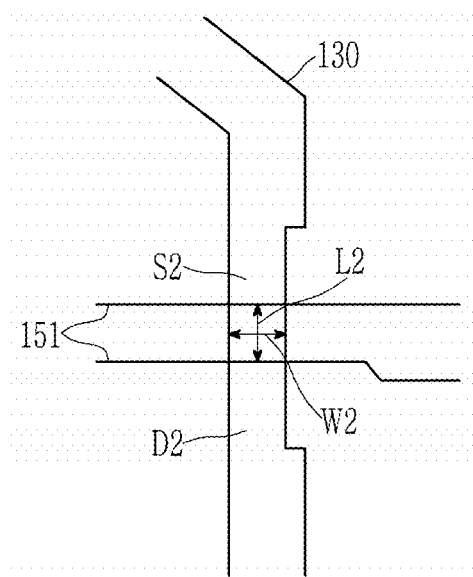
FIG. 9 illustrates an enlarged plan view of a second transistor of a light emitting display device according to an alternative embodiment.

FIG. 8 illustrates a plan view of a pixel of a light emitting display device according to an alternative embodiment, and FIG. 9 illustrates an enlarged plan view of a second transistor of a light emitting display device according to another embodiment.

In an embodiment, referring to FIG. 8, the scan line 151 may not include a portion protruding upward. As a result, the third transistor T3 having a single structure defined by only a single transistor is included in a pixel PX. In an embodiment of FIG. 8, the width of the channel of the third transistor T3 may be about 1.5 μm, and the length of the channel of the third transistor T3 may be about 2.0 μm.

In such an embodiment, the fourth transistor T4 has the dual structure as in the embodiments of FIG. 3 and FIG. 6, the width of the channel of the fourth transistor T4 may be about 1.5 μm, and the length of the channel of the fourth transistor T4 may be about 1.5 μm.

In an embodiment of FIG. 8, the size of the channel of the second transistor T2 is also formed to be small as illustrated in detail in FIG. 9.

Referring to FIG. 9, while the width L2 of the scan line 151 is reduced and the width W2 of the semiconductor layer 130 is reduced, the scan line 151 and the semiconductor layer 130 overlap each other to form the channel of the second transistor T2. As a result, the width and length of the channel of the second transistor T2 in FIG. 3 may be about 3.0 μm and about 4.4 μm, respectively, while the width and length of the channel of the second transistor T2 are reduced to 1.5 μm and 2.0 μm, respectively, in an embodiment of FIG. 8. Accordingly, even when the third transistor T3 has a single structure, a flicker due to a leakage current is reduced, and the flicker may not be viewed when driven at a low frequency of 30 Hz.

The width of the channel of the second transistor T2 may be in a range of about 1 μm to 2 about μm, and the length of the channel of the second transistor T2 may be in a range of about 1 μm to about 2.5 μm.

In an embodiment of the invention, as described herein, the flicker is not viewed even when driven at a low frequency such as 30 Hz by reducing the leakage current by reducing the size of the channel of the third transistor T3, the fourth transistor T4, or the second transistor T2.

The numerical range of the size of the channel may be variously modified, and a method for determining the size of the channel will hereinafter be described with reference to FIG. 10 to FIG. 16 below.

First, the leakage current, and the flicker viewed due to the leakage current will be described with reference to FIG. 10.

Figure 10:
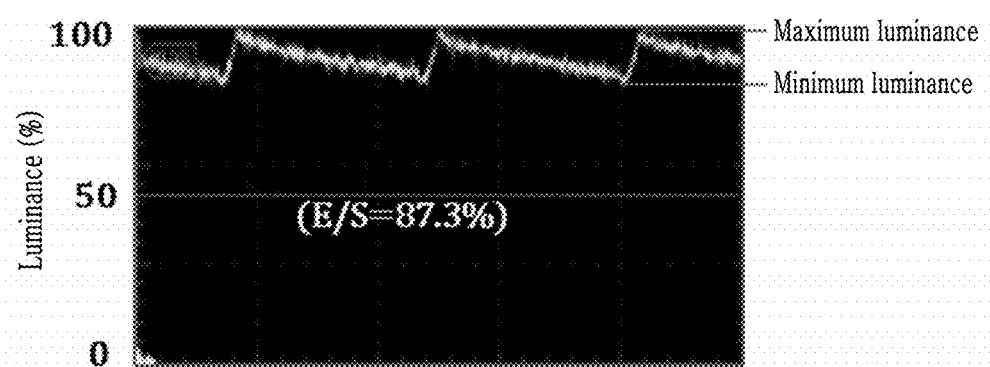
FIG. 10 is a graph showing leakage characteristics of a transistor including a polycrystalline semiconductor.

FIG. 10 is a graph showing leakage characteristics of a transistor including a polycrystalline semiconductor.

FIG. 10 is a graph of a flicker during low-frequency driving that occurs in a conventional light emitting display device.

In FIG. 10, a y-axis represents luminance, an x-axis represents time, and a luminance change when driven at a low frequency of 30 Hz is shown. In FIG. 10, E/S, which is a ratio of a minimum luminance to a maximum luminance, corresponds to 87.3%, and a luminance change of such a degree may be viewed or recognized by a user as a flicker.

In FIG. 10, it is illustrated that when a charging value of the storage capacitor Cst is changed by the leakage current in the pixel PX, as an amount of a current outputted from the driving transistor T1 decreases, luminance displayed by the light emitting diode gradually decreases. Generally, when driven at a high frequency of 60 Hz or higher, since a small leakage current occurs, no flicker may be viewed, but when driven at a low frequency of 30 Hz, as shown in FIG. 10, since the leakage current increases, a luminance difference increases, which is viewed by a user as a flicker.

According to a simulation, it can be confirmed that when driven at 30 Hz, a luminance change of 1% occurs when a leakage current of 7.5 femtoamperes (fA) occurs in the pixel. Accordingly, 7.5 fA may be a reference leakage current amount for preventing a flicker from being viewed.

Hereinafter, an embodiment of a method of determining the sizes of the channels of the third transistor T3, the fourth transistor T4, and the second transistor T2 to reduce the difference in luminance displayed by the light emitting diode by reducing the leakage current even when driven at a low frequency will be described with reference to FIG. 12 to FIG. 14.

Figure 11:
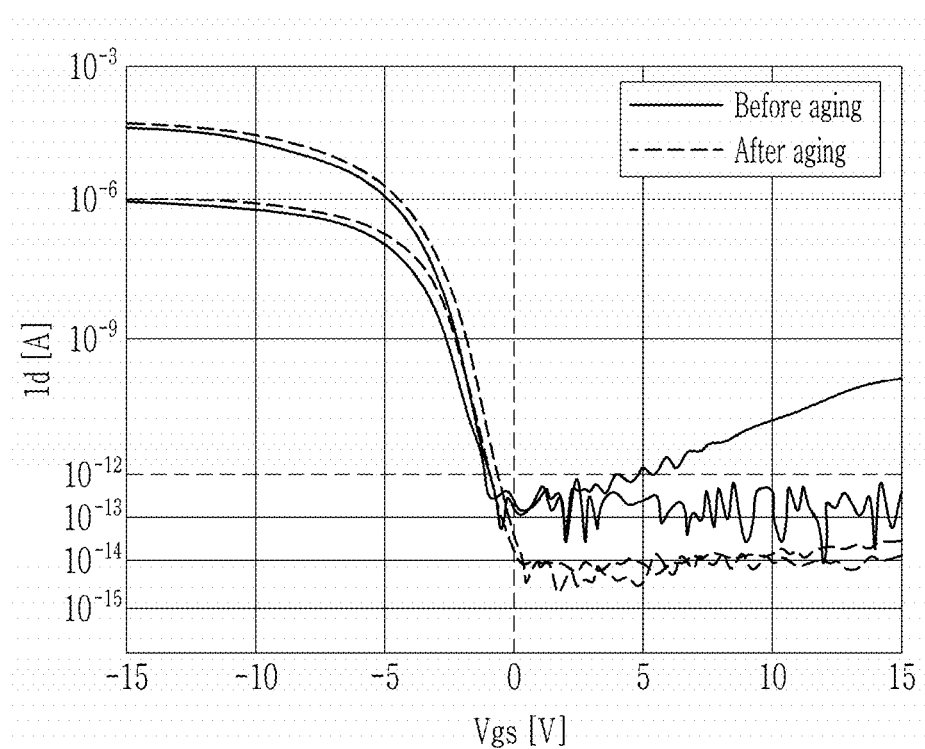
FIG. 11 is a graph showing current characteristics of a transistor including a polycrystalline semiconductor according to aging.

In FIG. 11, a characteristic change of a transistor including a polycrystalline semiconductor according to aging is illustrated.

FIG. 11 is a graph of current characteristics of a transistor including a polycrystalline semiconductor according to aging.

In FIG. 11, an x-axis represents a voltage difference between the gate electrode and the drain electrode, and a y-axis represents an output current.

FIG. 11 illustrates a graph in which characteristics of the third transistor T3 having a dual structure are simulated. As shown in FIG. 11, the output current is stabilized and constantly changed by aging.

The transistor including the polycrystalline semiconductor may be processed by an aging procedure, which may be desired to ensure that the output current characteristics are constant.

With reference to the characteristics of FIG. 10 and FIG. 11, a numerical range of the channel that prevents a flicker from being viewed by a user will be described below through FIG. 12 to FIG. 14.

First, in FIG. 12, an x-axis represents a driving frequency, and a y-axis represents an E/S ratio (hereinafter also referred to as a luminance ratio). The luminance ratio is a ratio between displayed maximum luminance and displayed minimum luminance, as illustrated in FIG. 10, and 100% is a case in which there is no leakage. When the luminance ratio is 100% as described above, no flicker is viewed even when driven at an ultra-low frequency of 10 Hz or less.

Figure 12:
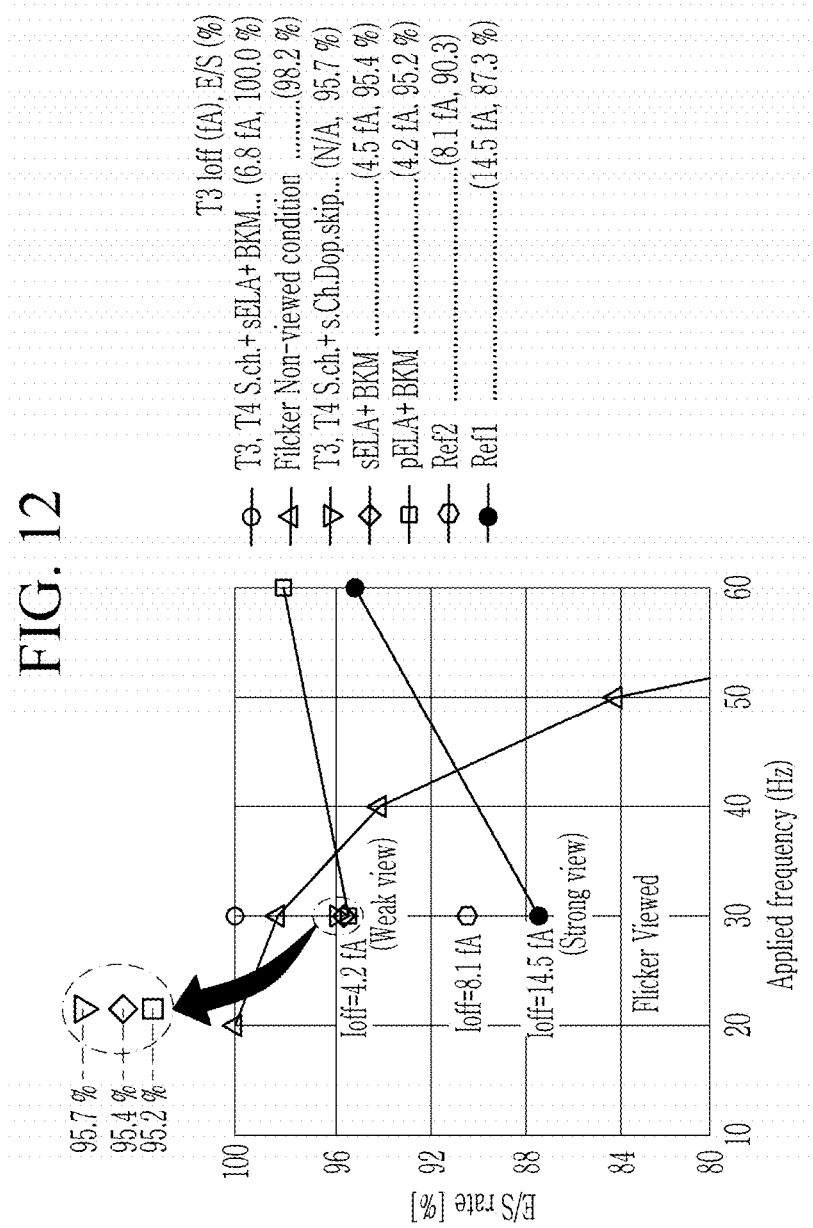
FIG. 12 to FIG. 16 are graphs showing low-frequency driving characteristics in a light emitting display device according to an embodiment.

In FIG. 12, a degree of the luminance ratio in which no flicker is viewed by a user based on each applied frequency is illustrated. Non-view corresponds to an optimal target of an embodiment of the invention, while a flicker may be viewed by a user in weak-view or strong-view.

FIG. 12 illustrates E/S ratios (luminance ratios) and experimental results of a leakage current value Ioff of the third transistor T3, in various comparative examples Ref1 and Ref2, and various embodiments of the invention. In the comparative examples Ref1 and Ref2, a flicker is viewed when low-frequency driving is performed at 50 Hz or less at a luminance ratio of 90% or less. Therefore, it is desired to prevent the flicker from being viewed.

In FIG. 12, sELA and pELA represent a method of crystallizing a semiconductor layer with an excimer laser, and "S.Ch" means a structure that is formed of a transistor having a dual structure and of which a channel width is 1.5 μm and a channel length is 1.5 μm, respectively. "Ch.Dop-.Skip" represents a case in which channel doping is not performed. In addition, "BKM" represents a case in which a semiconductor layer is crystallized with an excimer laser (ELA), cleaning processed with hydrogen fluoride (HF), plasma-treated with hydrogen (H$_2$), and aged.

Referring to FIG. 12, a case in which the luminance ratio (E/S ratio) corresponds to 95% is a case in which the BKM process is applied, so it is shown that there is no significant difference even when crystallized by an sELA or a pELA method.

In addition, although the BKM process is not applied, when the sizes of the channels of the third transistor T3 and the fourth transistor T4 are reduced, it is shown in FIG. 12 that the luminance ratio of 95% is obtained even though the channel is not doped.

When driven at a low frequency of 30 Hz, the luminance ratio (E/S ratio) of 98.2% or more is desired, so an embodiment with the luminance ratio of 95% may not be effectively used for 30 Hz. However, when driven at a low frequency of about 40 Hz, the low frequency driving may be effectively performed even with the luminance ratio of 95%.

Referring to FIG. 12, it is shown that applying the BKM process with an sELA laser while reducing the sizes of the channels of the third transistor T3 and the fourth transistor T4 has the luminance ratio of 100%, and thus may be driven at any low frequency.

Figure 13:
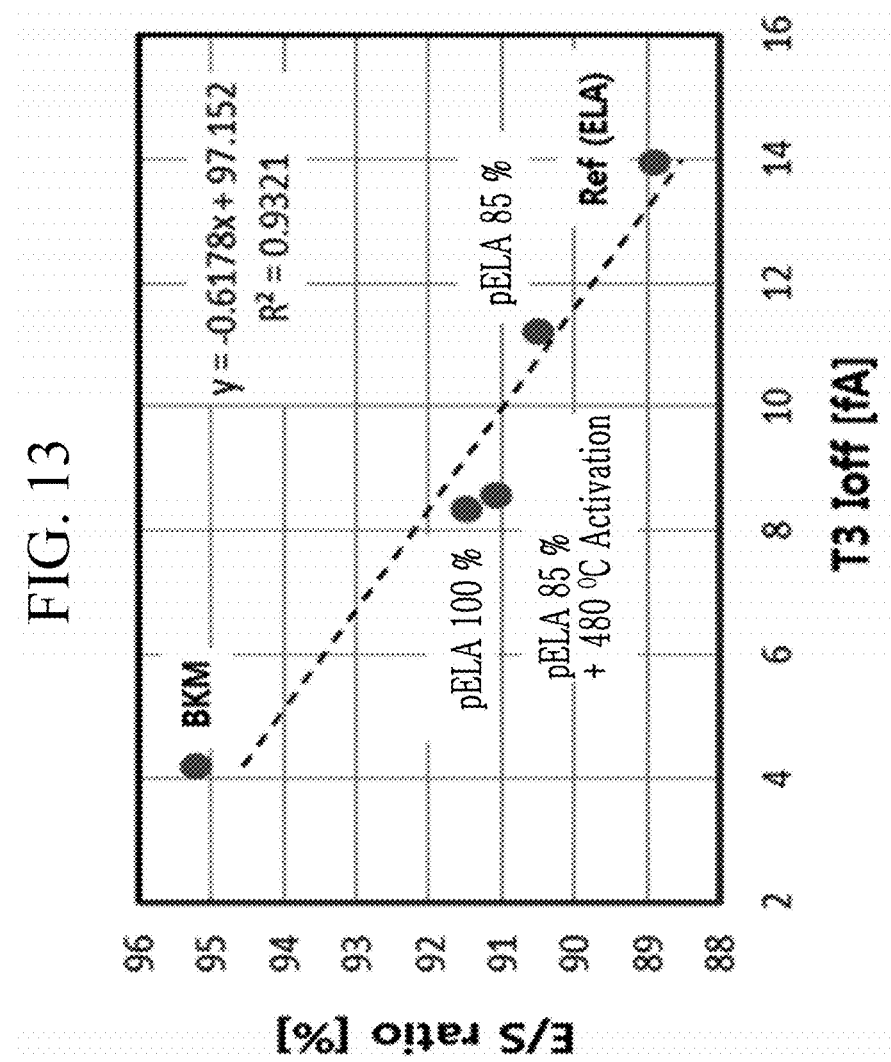

FIG. 13 shows the luminance ratio (E/S ratio) with respect to the leakage current value Ioff of the third transistor T3 included in FIG. 12.

FIG. 13 shows that a relationship between the luminance ratio (E/S ratio) and the leakage current value (Ioff) may be obtained based on a value obtained by an experiment as shown by a dotted line.

In FIG. 13, it is shown that the leakage current value Ioff decreases as the luminance ratio (E/S ratio) increases.

Figure 14:
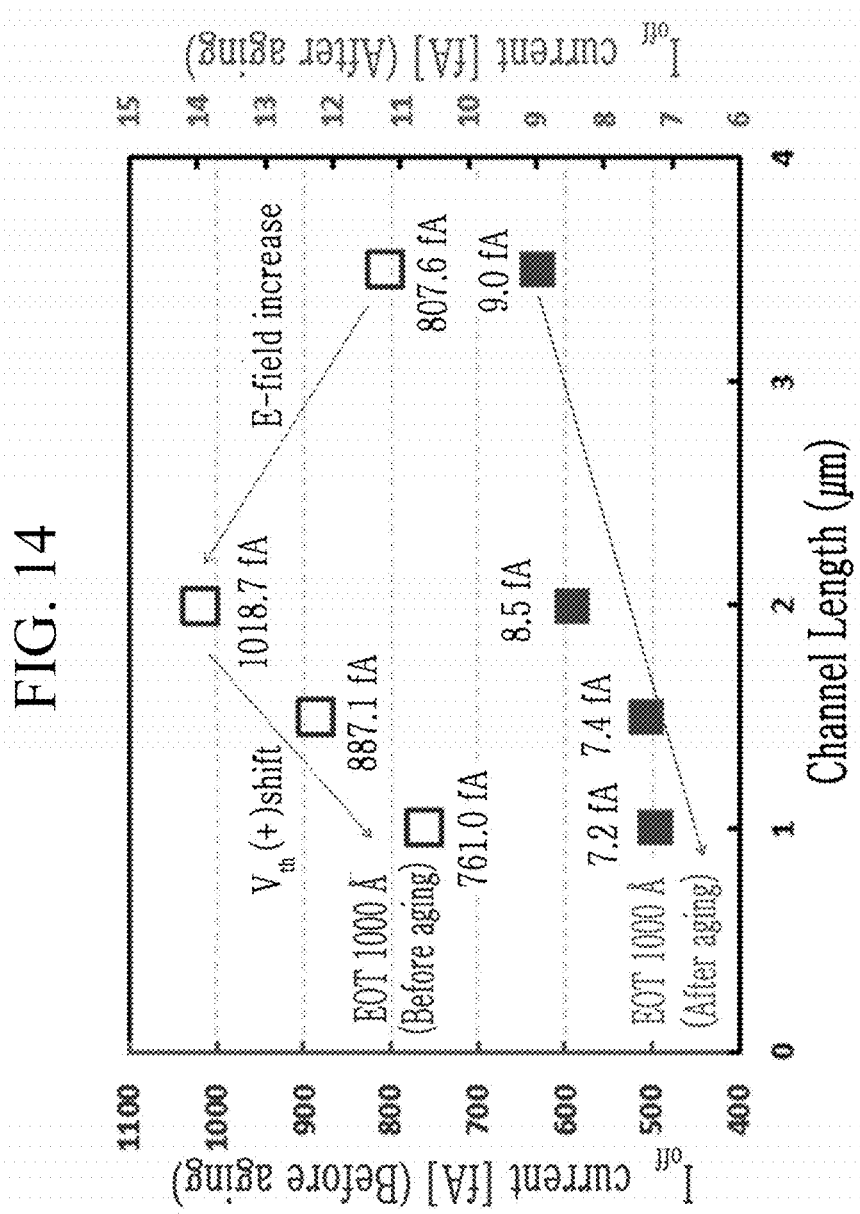

FIG. 14 shows the length of the channel with respect to the leakage current value Ioff, before and after aging.

In FIG. 14, it is shown that when no aging is performed, the length of the channel with respect to the leakage current value Ioff appears to have no linear relationship; while after the aging is performed, the channel length with respect to the leakage current value Ioff has a linear relationship. That is, when the aging is not performed, as the length of the channel decreases, a portion in which electrons are accumulated in the channel portion increases according to an increase in an electric field (E-field), and thus the leakage current increases. The leakage current may also be referred to as gate induced drain leakage ("GIDL"). However, such an increase in the leakage current does not occur when the channel length is a predetermined value or less, and in this case, a region in which the GIDL leakage current is generated is reduced while a threshold voltage is shifted in a positive (+) direction, and as a result, the leakage current is reduced. However, when the aging is performed, it is shown that the leakage current does not increase due to the accumulation of electrons, and the GIDL leakage current is removed, so that the leakage current is constantly decreased as the channel length decreases.

In FIG. 14, it is shown that in the case of the aged transistor, when only the length of the channel is reduced, the leakage current is smaller than 7.5 fA (reference leakage current value). Here, 7.6 fA is a reference leakage current value, which is a leakage current value in a case in which the luminance decreases by 1% when driven at 30 Hz, and some embodiments have a smaller leakage current value, so 7.6 fA means that the luminance is changed by 1% or less. Therefore, a user may not view a flicker.

Referring to FIG. 12 to FIG. 14, when a low frequency to be displayed is determined, a desired luminance ratio corresponding to the low frequency is shown in FIG. 12, and the leakage current value Ioff corresponding to the luminance ratio is shown in FIG. 13. Then, a channel may be formed by checking the length of the channel desired for the corresponding leakage current value Ioff in FIG. 14, and then to the transistor may effectively operate at a low frequency at which no flicker is viewed by reducing the leakage current.

The width of the channel of the third transistor T2 according to the experiment may be in a range of about 1 μm to about 2 μm, and the length of the channel of the third transistor T2 may be in a range of about 1 μm to about 2.5 μm.

In addition, it is shown that the flicker was removed when the size of the channels of the fourth transistor T4 and the second transistor T2 are determined based on the results of the experiment as described above. Particularly, in an embodiment of FIG. 7 in which the third transistor T3 has the single structure, reducing the size of the channel of the second transistor T2 is also more effective in removing the flicker.

Figure 15:
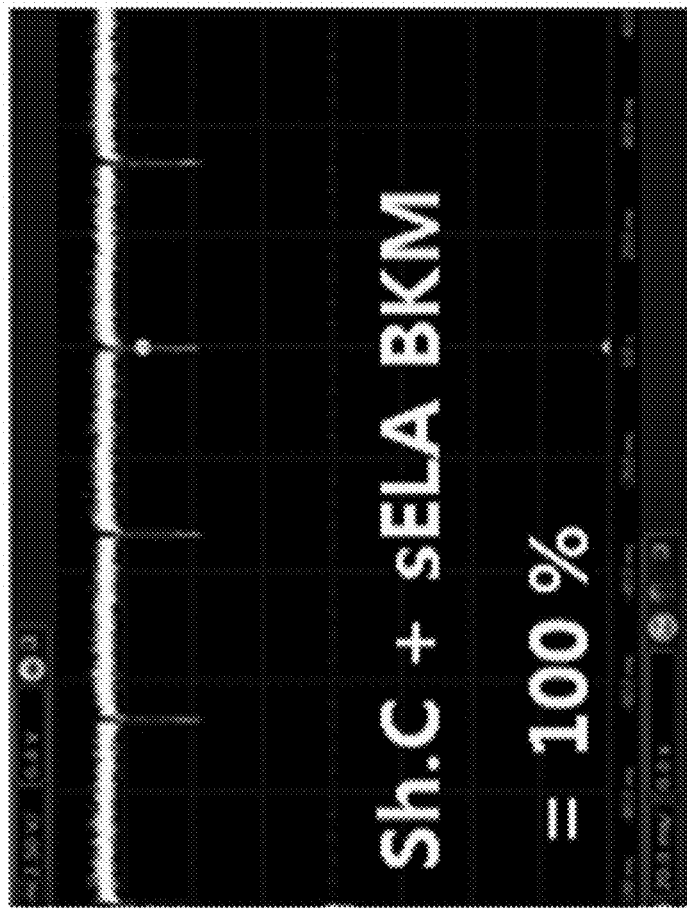
Figure 16:
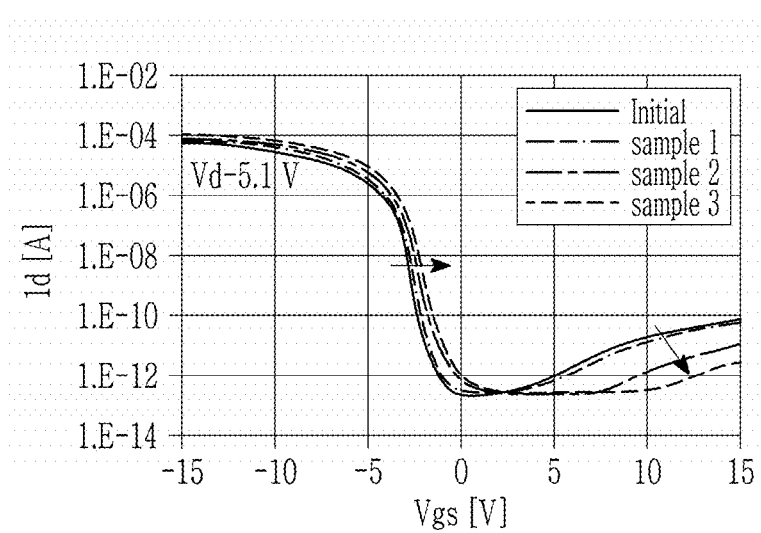

Referring to FIG. 15, the luminance change with time when a 100% luminance ratio is shown in FIG. 12 is illustrated, and referring to FIG. 16, it is shown that the output current of the third transistor T3 is stabilized by the aging.

In FIG. 16, changes in output current are illustrated in an initial state (Initial) and three samples as the aging proceeds. Here, Sample 1 is a case in which a charge (Q) fixed to the channel is a charge number of $-1E11$ $cm^{-2}$, which means numbers of charges disposed in an unit area of 1 $cm^2$, Sample 2 is a case in which the charge (Q) fixed to the channel is a charge number of $-1E12$ $cm^{-2}$, and Sample 3 is a case in which the charge (Q) fixed to the channel is a charge number of $-2E12$ $cm^{-2}$. Accordingly, it is shown that as the aging proceeds, the fixed charge (Q) gradually increases as compared to the initial state, that is, the charge accumulated in the channel portion, such that the output current is gradually stabilized while removing the GIDL leakage current.

Generally, due to the position of the third transistor T3 in a pixel, the first and second electrodes of the third transistor T3 may not receive a voltage directly from the outside of the pixel, so the effect of aging is lower than that of other transistors. In an embodiment of the invention, the size of the channel is reduced as described herein, such that the effect of aging is increased, and the voltage may be effectively stabilized as shown in FIG. 16. Therefore, in an embodiment of the invention, the effect of aging of the third transistor T3 is also increased, resulting in a decrease in the leakage current.

Hereinafter, the process of forming the polycrystalline semiconductor among the BKM processes mentioned in FIG. 12 will be described in greater detail with reference to FIG. 17 and FIG. 18.

Figure 17:
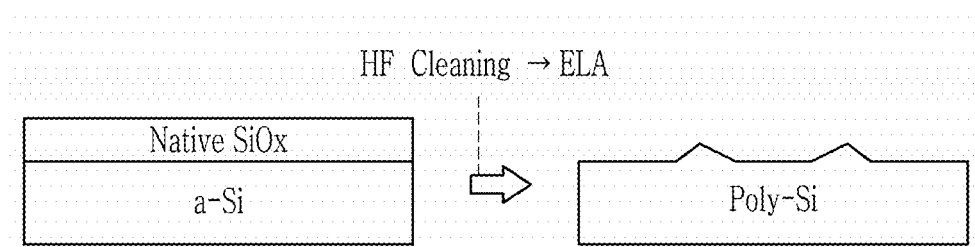
FIG. 17 and FIG. 18 illustrate views of a procedure for manufacturing a polycrystalline semiconductor in a transistor including a polycrystalline semiconductor according to an embodiment.
Figure 18:
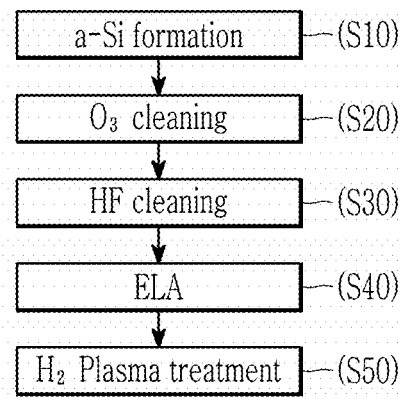

FIG. 17 and FIG. 18 illustrate views of a procedure for manufacturing a polycrystalline semiconductor in a transistor including a polycrystalline semiconductor according to an embodiment.

According to the processes of FIG. 17 and FIG. 18, it was confirmed that the leakage current decreased as a size of a surface protrusion formed when crystallized into a polycrystalline semiconductor decreased.

Referring to FIG. 17 and FIG. 18, amorphous silicon (a-Si) is first formed on the substrate or on the buffer layer on the substrate (S10).

When the amorphous silicon (a-Si) is formed, since a silicon oxide film is naturally formed (see FIG. 17), it is desired to remove the silicon oxide (SiOx) film. In an embodiment, first cleaning with ozone ($O_3$) is performed (S20) to remove the silicon oxide (SiOx) film.

Thereafter, additional cleaning with HF is performed (S30), and in this case, the cleaning process is performed with HF having a predetermined concentration for a predetermined time, and the cleaning process may be variously modified.

Then, a crystallization is performed by irradiating an excimer laser (ELA) (S40).

Thereafter, plasma treatment is performed with hydrogen ($H_2$) on a surface of the crystallized semiconductor (S50).

Through the processes described above, a size of the protrusion formed on the surface of the crystallized semiconductor is reduced, so that the leakage current is also reduced.

Hereinafter, an embodiment having a structure for reducing the leakage current of the transistor by adjusting the thickness of the gate insulating film will be described with reference to FIGS. 19 to 20B.

FIG. 19 illustrates a change of a channel length in a transistor including a polycrystalline semiconductor according to an embodiment, and FIGS. 20A and 20B illustrate cross-sectional views of a first gate insulating film according to embodiments.

First, referring to FIG. 19, in the transistor including the polycrystalline semiconductor, when the length of the channel is reduced by half of that of a conventional transistor, that is, reduced to be about 1.5 µm, the leakage current is reduced as described above. Here, the length of the channel of the transistor may be in a range of about 1 µm to about 2.5 µm.

In such an embodiment, it was confirmed that the leakage characteristics of the transistor were additionally changed by adjusting the thickness of the first gate insulating film 141 positioned between the semiconductor layer 130 and the gate electrode.

Referring to FIGS. 20A and 20B, an embodiment of the first gate insulating film 141 may be formed of or defined by only a silicon oxide film (SiOx) (FIG. 20A), or may be formed of or collectively defined by a silicon nitride film (SiNx) and a silicon oxide film (SiOx) (FIG. 20B).

Referring to FIG. 20A, the thickness of the first gate insulating film 141 formed only of the silicon oxide layer (SiOx) may be about 1000 Å, which is thinner than a conventional first gate insulating film. Due to the thinner first gate insulating film 141, the gate electrode and the polycrystalline semiconductor layer 130 are positioned closer to each other, thus the characteristics of the transistor are changed and the leakage current is reduced. As such, in an embodiment, the thickness of the first gate insulating film formed only of the silicon oxide film (SiOx) may be in a range of about 800 Å to about 1200 Å.

In an alternative embodiment, referring to FIG. 20B, a silicon oxide film (SiOx) is formed on the polycrystalline semiconductor layer 130, and a silicon nitride film (SiNx) is formed on the silicon oxide film (SiOx) to define the first gate insulating film 141. In such an embodiment, a total thickness of the first gate insulating film 141 is thicker than that of the embodiment of FIG. 20A. In such an embodiment of FIG. 20B, a silicon oxide film (SiOx) may have a thickness of about 700 Å is formed and a silicon nitride film (SiNx) may have a thickness of about 500 Å to form a transistor having a substantially same characteristics as the first gate insulating film 141 formed of a silicon oxide film (SiOx) of 1000 A as shown in FIG. 20A. The thickness of the first gate insulating film 141 of a double film of FIG. 20B may be changed to the thickness of the silicon oxide film (SiOx) of a single film based on Equation 1 below. Since the EOT value of a double film structure having a silicon oxide film (SiOx) of 700 Å and a silicon nitride film (SiNx) of 500 Å may be 1000 Å according to the following Equation 1, the double film has a same feature as the silicon oxide layer (SiOx) of the single film.

$$EOT = T_{SiOx} + (\varepsilon_{SiOx}/\varepsilon_{Double\,film}) \times T_{Double\,film} \quad \text{[Equation 1]}$$

In Equation 1, EOT denotes an equivalent oxide thickness, which means a thickness value obtained by changing the thickness of the double film of the silicon nitride film and the silicon oxide film to the thickness of the single film of the silicon oxide film, T denotes a thickness, and ε denotes a dielectric constant. Accordingly, $T_{SiOx}$ is a thickness of the silicon oxide film (SiOx), which corresponds to a lower layer, $T_{Double\,film}$ is a sum of the thicknesses of the two films, $\varepsilon_{SiOx}$ is a dielectric constant of the lower film of silicon oxide (SiOx), and $T_{Double\,film}$ is a dielectric constant value for the two films.

When the thickness of the double film of FIG. 20B is converted to that of the single film of silicon oxide film (SiOx) by Equation 1, the converted thickness (or the equivalent oxide thickness of the double film) may be in a range of about 800 Å to about 1200 Å.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A light emitting display device, comprising:
   a light emitting element;
   a second transistor connected to a scan line;
   a first transistor which applies a current to the light emitting element;
   a capacitor connected to a gate electrode of the first transistor; and
   a third transistor connected to an output electrode of the first transistor and the gate electrode of the first transistor,
   wherein channels of the second transistor, the first transistor, and the third transistor are disposed in a polycrystalline semiconductor layer, and
   a width of a channel of the third transistor is in a range of 1 μm to 2 μm, and a length of the channel of the third transistor is in a range of 1 μm to 2.5 μm.

2. The light emitting display device of claim 1, wherein the third transistor has a dual structure.

3. The light emitting display device of claim 2, wherein the width of the channel of the third transistor is in a range of ⅓ to ½ of a width of the channel of the first transistor.

4. The light emitting display device of claim 1, further comprising:
   a fourth transistor which initializes the gate electrode of the first transistor to an initializing voltage,
   wherein a width of a channel of the fourth transistor is in a range of 1 μm to 2 μm, and a length of the channel of the fourth transistor is in a range of 1 μm to 2.5 μm.

5. The light emitting display device of claim 4, wherein the fourth transistor has a dual structure.

6. The light emitting display device of claim 5, wherein the width of the channel of the fourth transistor is in a range of ⅓ to ½ of a width of the channel of the first transistor.

7. The light emitting display device of claim 6, further comprising:
   a fifth transistor connected between the first transistor and a driving voltage line; and
   a sixth transistor connected between the light emitting element and the first transistor,
   wherein the length of the channel of the third transistor is in a range of ⅓ to ½ of a length of a channel of the fifth transistor or the sixth transistor.

8. The light emitting display device of claim 7, wherein the length of the channel of the fourth transistor is in a range of ⅓ to ½ of a length of a channel of the fifth transistor or the sixth transistor.

9. The light emitting display device of claim 7, wherein the third transistor has a single structure.

10. The light emitting display device of claim 9, wherein a width of a channel of the second transistor is in a range of 1 μm to 2 μm, and a length of the channel of the second transistor is in a range of 1 μm to 2.5 μm.

11. The light emitting display device of claim 10, wherein the width of the channel of the second transistor is in a rage of ⅓ to ½ of a width of the channel of the first transistor.

12. The light emitting display device of claim 10, wherein the length of the channel of the second transistor is in a range of ⅓ to ½ of a length of a channel of the fifth transistor or the sixth transistor.

13. The light emitting display device of claim 1, further comprising:
   a gate insulating film covering the polycrystalline semiconductor layer,
   wherein the gate insulating film is defined by one of a single layer of silicon oxide film and a double layer of a silicon nitride film and the silicon oxide film,
   wherein the gate insulating film has a thickness value in a range of 800 Å to 1200 Å,
   wherein the thickness value of the gate insulating film is a thickness of the single layer of the silicon oxide film or a converted thickness of the double layer of the silicon nitride film and the silicon oxide film to the thickness of the single layer of the silicon oxide film.

14. The light emitting display device of claim 1, wherein the light emitting display device is driven even at a low frequency of 60 Hz or less.

15. A display device comprising:
   a substrate;
   a semiconductor layer disposed on the substrate, wherein the semiconductor layer includes a polycrystalline semiconductor;
   a first gate insulating film covering the semiconductor layer;
   a first gate conductor disposed on the first gate insulating film;
   a second gate insulating film covering the first gate conductor and the first gate insulating film;
   a second gate conductor disposed on the second gate insulating film;
   an interlayer insulating film covering the second gate conductor and the second gate insulating film;
   a data conductor disposed on the interlayer insulating film; and
   a passivation film covering the data conductor and the interlayer insulating film,
   wherein the first gate insulating film is defined by one of a single later of a silicon oxide film and a double later of a silicon nitride film and the silicon oxide film,
   wherein the first gate insulating film has a thickness value in a range of 800 Å to 1200 Å,
   wherein the thickness value of the first gate insulating film is a thickness of the single layer of the silicon oxide film or a converted thickness of the double layer of the silicon nitride film and the silicon oxide film to the thickness of the single layer of the silicon oxide film, and
   wherein a length of a channel of a transistor defined by a portion of the semiconductor later is in a range of 1 μm to 2.5 μm.

16. The light emitting display device of claim 15, wherein the first gate insulating film is the single film of the silicon oxide film.

17. The light emitting display device of claim 15, wherein the first gate insulating film is the double layer of the silicon nitride film and the silicon oxide film, wherein the silicon oxide film is disposed on the semiconductor layer, and the silicon nitride film is disposed on the silicon oxide film.

\* \* \* \* \*